(12) United States Patent
Koizumi

(10) Patent No.: US 6,552,712 B1
(45) Date of Patent: Apr. 22, 2003

(54) SEMICONDUCTOR DEVICE, LIQUID CRYSTAL DISPLAY, AND ELECTRONIC EQUIPMENT INCLUDING THE SAME

(75) Inventor: Norio Koizumi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/242,106

(22) PCT Filed: Jun. 8, 1998

(86) PCT No.: PCT/JP98/02523

§ 371 (c)(1),
(2), (4) Date: May 3, 1999

(87) PCT Pub. No.: WO98/57375

PCT Pub. Date: Dec. 17, 1998

(30) Foreign Application Priority Data

Jun. 11, 1997 (JP) ............................. 9-154060

(51) Int. Cl.[7] ............................. G09G 3/36; G02B 6/36
(52) U.S. Cl. ..................... 345/104; 345/207; 345/87; 345/88; 345/89; 250/211; 250/212; 250/213; 250/227.11; 250/227.12; 250/227.28
(58) Field of Search .................. 345/87, 88, 89, 345/104, 207; 250/227.11, 227.12, 227.28, 211, 212, 213

(56) References Cited

U.S. PATENT DOCUMENTS

| | | | |
|---|---|---|---|
| 4,514,727 A | * 4/1985 | Van Antwerp | ............... 345/691 |
| 5,235,201 A | 8/1993 | Honna | |
| 5,406,305 A | * 4/1995 | Shimomura et al. | ......... 345/102 |
| 5,491,358 A | 2/1996 | Miyata | |
| 5,854,089 A | * 12/1998 | Nakatsu | ...................... 438/41 |
| 5,889,903 A | * 3/1999 | Rao | ........................... 385/14 |
| 5,946,561 A | * 8/1999 | Yamazaki et al. | .......... 438/166 |
| 6,320,325 B1 | * 11/2001 | Cok et al. | ................ 315/169.3 |

FOREIGN PATENT DOCUMENTS

| | | |
|---|---|---|
| EP | 0 421 403 A2 | 4/1991 |
| JP | A-62-77619 | 4/1987 |
| JP | A-4-349661 | 12/1992 |
| JP | A-5-315552 | 11/1993 |
| JP | A-7-29972 | 1/1995 |
| JP | A-7-234736 | 9/1995 |
| JP | A-7-239726 | 9/1995 |
| JP | 8-190106 | 7/1996 |

* cited by examiner

Primary Examiner—Richard Hjerpe
Assistant Examiner—Jean Lesperance
(74) Attorney, Agent, or Firm—Oliff & Berridge, PLC

(57) ABSTRACT

The semiconductor device according to the present invention comprises at least one first semiconductor circuit 2 in which first currents (Ihva1 to Ihva4) excited by external light (hv) are produced. It further comprises at least one second semiconductor circuit (3) which is electrically connected to the first semiconductor circuit (2) and in which second currents (Ihvb1 to Ihvb4) excited based on the external light (hv) and canceling a part or all of the voltage fluctuation produced by the current increment of the first currents (Ihva1 to Ihva4) when the external light (hv) shines are produced.

16 Claims, 22 Drawing Sheets

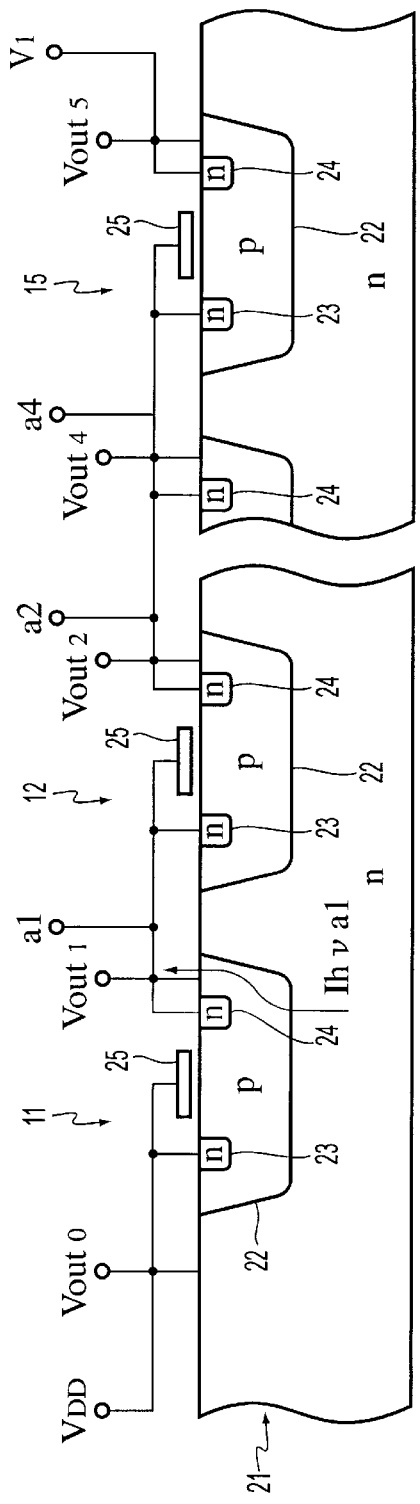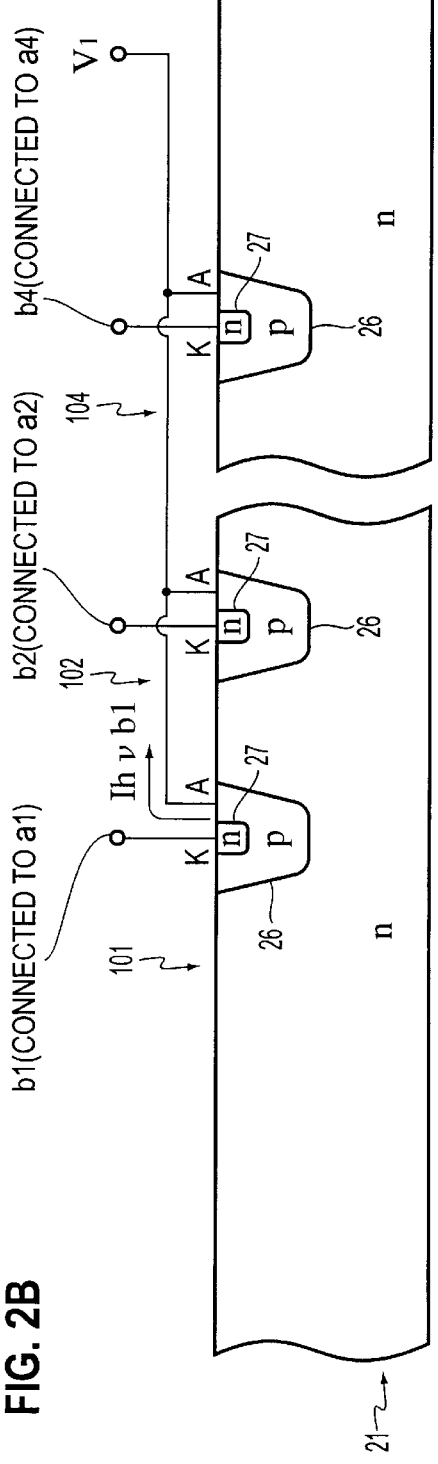
FIG. 2A
FIG. 2B

SEMICONDUCTOR DEVICE, LIQUID CRYSTAL DISPLAY, AND ELECTRONIC EQUIPMENT INCLUDING THE SAME

TECHNICAL FIELD

The present invention relates to a semiconductor device, liquid crystal display and electronic equipment including these, and, more particularly, to a semiconductor device which is used in an environment exposed to external light.

BACKGROUND ART

In general, when a semiconductor circuit is irradiated with light, an electric current is generated in the semiconductor circuit causing a malfunction. Therefore, in order to prevent such occurrence of an electric current due to light in a semiconductor circuit, a mounting form for packaging the semiconductor circuit to shade it from light has been basically adopted. Specifically, an IC chip on which a semiconductor circuit has been formed is mounted on a circuit board such as a molded material to be packaged, and a liquid crystal display is formed by connecting the packaged circuit board and an LCD panel substrate by a heat seal. Alternatively, the liquid crystal display is also formed by connecting a TCP (Tape Carrier Package) in which an IC chip is mounted on a tape with a conductive film to the LCD panel substrate.

In such a mounting form (TCP or packaged circuit board), it is possible to shade light with a molded material at a mounted position.

However, in the form of a mounting module referred to as a COG (Chip On Glass) in which an IC chip is mounted on a side of a LCD panel substrate, the IC chip is mounted on a glass substrate constituting the LCD panel substrate, so that the IC chip can not be packaged and also light can not be shaded.

The reason will be described in more detail using, for example, a liquid crystal drive circuit indicated in FIG. 19. An example of a drive circuit for a COG (Chip On Glass) type of general liquid crystal display is indicated in FIGS. 19A and 19B. A semiconductor circuit used in an environment exposed to external light is hereinafter referred to as "a principal circuit".

In FIG. 19A, a liquid crystal LC is enclosed between a transparent glass substrate 1381 and an LCD panel 1382. A pixel electrode array 1383 (a layer for forming the pixel electrode array) is formed on the glass substrate 1381. In addition, a principal circuit 1384 which is composed of semiconductor elements such as IC chips is also formed on the glass substrate 1381. The principal circuit 1384 includes, for example, a shift register circuit, drive circuit, and power supply circuit Hereinafter, a power supply circuit will be used as an example of this principal circuit.

FIG. 19B shows a partially enlarged portion of the principal circuit shown in FIG. 19A. The principal circuit 1384 is mounted on the glass substrate 1381 through an anisotropic dielectric film (AFC) 1385. Incidentally, a terminal pulled out from the principal circuit 1384 is connected to an external circuit through a flexible connector, which is not shown. Furthermore, the principal circuit 1384 is covered with an opaque resin layer 1386 for circuit protection and an aluminum film for a shield, not shown. Therefore, the principal circuit 1384 is not exposed to direct light from the upper side of FIGS. 19A and 195.

However, a part of the light passing through the LCD panel 1382(for example, light from back light and natural light) irradiates the principal circuit 1384 through the inside of the glass substrate 1381 along a path indicated by the arrow F in FIG. 19A. Thus, carriers based on this light are light excited in addition to a usual drive current in the principal circuit 1384 to generate an unnecessary current (hereinafter, this current is referred to as "a light excited current").

In order to remove such a disadvantage, it is conceivable to prevent the occurrence of the light excited current described above by shading based on the methods of making the anisotropic conductive film 1385 completely opaque and incorporating pigment in the anisotropic conductive film 1385.

However, when an alignment mark is formed on the surface of the glass substrate 1381 to mount the principal circuit 1384 formed in an IC chip, the alignment mark will be hidden by the anisotropic conductive film 1385 when the IC chip is bonded to the glass substrate, so that it is impossible to align the principal circuit 1384 and the glass substrate 1381.

Moreover, even if the alignment can be performed advantageously by making the anisotropic conductive film 1385 opaque, the electric and chemical characteristics of the semiconductor circuit may deteriorate because of the pigment.

In addition, when the anisotropic conductive film 1385 is depressed in the vertical direction, included metal particles are caused to contact each other to make the depressed portion electrically conductive. For this reason, if a thick anisotropic conductive film 1385 is formed in order to improve the shading function, the mutual contact of the metal particles due to depression is not performed advantageously, so that electric conduction can not be assured.

Next, a circuit configuration of the principal circuit 1384 will be explained. In this case, a power supply circuit constituting the principal circuit typically has a bias circuit with outputs of Vout1 to Vout5 in multiple stages, for example, five stages in order to drive an LCD panel and LCD drive circuit by using a voltage drop method or MLS. Problems when the light excited current described above is generated in the power supply circuit will be explained below with reference to FIGS. 20A and 20B.

FIG. 20A is a circuit diagram showing a conventional power supply circuit. This power supply circuit is composed of a multistage connection circuit in which n-type FETs 1391 to 1395 are connected in multistage, and a bias voltage VDD is applied to one end and a voltage V1 is applied to the other. In addition, voltages Vout0 and Vout5 are output from both ends of this multistage connection circuit. Each of the voltages vout1 to Vout 4 is output through voltage follower circuits A1 to A4 from between a source electrode of FET1391 and a drain electrode of FET1392, between a source electrode of FET1392 and a drain electrode of FET1393, between a source electrode of FET1393 and a drain electrode of FET1394, and between a source electrode of FET1394 and a drain electrode of FET1395, respectively.

FIG. 20B is a cross-sectional view of the structure of a portion of the FETs 1391 and 1392 in the power supply circuit. The FETs 1391 and 1392 are formed on an n-type substrate 1401. P-type well regions 1402 are formed in the n-type substrate 1401, and n-type drain regions 1403 and n-type source regions 1404 are formed in the p-type well regions 1402. Additionally, gate electrodes 1405 are formed above and between the n-type drain regions 1403 and n-type source regions 1404 through an insulation layer not shown.

A voltage VDD is applied to the gate electrode 1405 of the FET 1391, n-type drain regions 1403, and the n-type substrate 1401. The VDD is also connected to an output terminal Vout0, and the n-type source region 1404 of the FET 1391 and the n-type drain region 1403 of the FET 1392 are connected to an output terminal Vout1.

The connections between the FETs 1392 and 1393, FETs 1393 and 1394, and FETs 1394 and 1395 are similar to that between the FETs 1391 and 1392, so that the n-type source electrodes of the FETS in the front stages are connected to the n-type drain regions and gate electrodes of the FETS in the later stages. Further, the connection lines for each FET are connected to output terminals Vout2 to Vout4 through the voltage followers A2, A3, and A4, respectively.

FIG. 20B shows that external light having an energy of hv irradiates the back side of the n-type substrate 1401, where h is Planck's constant and v is c/λ (c is the velocity of light and λ is the wavelength). When this external light (hereinafter, external light is referred to as "hv") is irradiated, holes are generated in an n-type substrate region 1406 of the n-type substrate 1401 in accordance with wavelength ingredients (hvA) of some range in hv. On the other hand, electrons are generated in the p-type well regions 1402 in accordance with wavelength ingredients (hvB) of some range in hv. As a result, a part of the holes generated in the n-type substrate region 1406 exceeds a boundary between the n-type substrate region 1406 and p-type well region 1402 to reach the p-type well region 1402. Also, a part of the electrons generated in the p-type well region 1402 exceeds the boundary described above to reach n-type substrate region 1406. In FIG. 20B, the light excited electrons generated at this time are designated by "−" and the light excited currents in the FET1391 and FET1392 are designated by Ihva1 and Ihva2, respectively.

On the other hand, holes are generated in the n-type drain regions 1403 and the n-type source regions 1404 in accordance with wavelength ingredients (hvC) of some range in hv, and a part of the holes reaches the p-type well regions 1402. In addition, a part of the electrons generated in accordance with the wavelength ingredients of some range indicated by hvB described above reaches the n-type drain regions 1403 and the n-type source regions 1404. In FIG. 20B, light excited currents generated at this time in the FET1391 and FET1392 are indicated by Ihvb and Ihvc, respectively.

FIG. 21A is an equivalent circuit of FIG. 20A when light is not shone and FIG. 21B shows an equivalent circuit of FIG. 20A when light is irradiated. When light is not shone, as shown in FIG. 21A, resistance values of equivalent resistances 1491, 1492, 1493, 1494, and 1495 between the drain and source of the respective FETs 1391 to 1395 are the same, and the values of the voltage drop in each of the FETs 1391 to 1395 are kept constant.

However, when light is shone, as shown in FIG. 21B, equivalent resistances 1491, 1492, 1493, 1494, and 1495 between the drain and source of the respective FETs 1391 to 1395 have substantially different values. That is, the light excited currents Ihvb and Ihvc described above have substantially the same value and flow in a direction such that the currents cancel each other, therefore the resistance values of the equivalent resistances 1491, 1492, 1493, 1494, and 1495 are not affected. However, the light excited currents Ihva1 and Ihva2 described above and further light excited currents Ihva3, Ihva4, and Ihva5 in the FETs 1393, 1394, and 1395 not shown in FIG. 20B flow between the voltage terminal VDD and the p-type well region 1402 of FETs 1391 to 1395, respectively. Accordingly, the balance of the voltage drop between each drain and source of the FETs 1391 to 1395 may collapse, and a problem may occur whereby the voltage between the drain and source becomes larger as a FET is farther from the VDD terminal.

Thus, when light irradiates the FETS 1391 to 1395, the lower the currents flowing through these FETS, the more they increase, making the impedance of each FET uneven, so that each electric potential of Vout0 to Vout5 is caused to fluctuate.

When light is incident on high impedance portions in this manner, currents due to the light may be generated, causing the bias to increase, so that incorrect operation may result, such as the display screen becoming black even though the characters on the screen are visible.

There were problems such that data displayed on a liquid crystal display panel might be transformed, originating from such voltage fluctuation and, further, the voltage of analog circuits in the liquid crystal display might be shifted or an oscillation circuit in the same might be stopped.

Furthermore, if an LCD driver is not provided with light resistance to some extent, light may be incident on the LCD driver, resulting in malfunction, so that the LCD panel may fail to display. On the contrary, there was a problem that the LCD panel can not display without light. In this way, there was a limitation to the display without incorrect operation in the conventional configuration.

In addition, even if the mounting form based on a TCP is adopted, light from the front or side surface can be intercepted as mounting is performed on the front and side surfaces, but light from the rear side can not be intercepted, so that there is the possibility that the same problem as described above may arise.

Moreover, in liquid crystal displays, from the viewpoint of low power consumption, a low voltage specification is likely to become a mainstream, so that a power supply circuit with less voltage fluctuations has been required as small voltage fluctuations may significantly influence display operation in liquid crystal displays on which a power supply is mounted.

The present invention is made to solve the above mentioned technical problems, and the object is to provide a semiconductor device, liquid crystal display, and electronic equipment including these, in which, even if external light irradiates the principal circuit to generate light excited carriers, malfunction can be prevented by canceling or reducing the influence of the light excited carriers without adopting any optical shading means, and display can be well achieved.

DISCLOSURE OF THE INVENTION

The semiconductor device according to the present invention comprises at least one first semiconductor circuit in which a first current excited by external light is generated. Further, the semiconductor device is also provided with at least one second semiconductor circuit which is electrically connected to said first semiconductor circuit and is excited by said external light and in which a second current is generated to cancel a part or all of the voltage fluctuations produced by a current increment of said first current when said external light is shone.

Inventors of the present invention found that, when carriers were excited in a first semiconductor circuit due to irradiation by external light, the influence upon any external circuit or load produced in the first semiconductor circuit could be canceled or reduced by producing a second current to cancel a part or all of the voltage fluctuation produced by the current increment of the first current due to the carriers by another second semiconductor circuit based on the external light, causing the second current to flow into the first semiconductor circuit.

A substrate which constitutes the first semiconductor circuit is generally transparent or translucent, although in some cases it is opaque. In the present application, the term "translucent" refers to a degree of light penetration in which, when carriers are excited by external light in the first semiconductor circuit, the carriers any influence operation of the first semiconductor circuit. Further, the external light includes both natural and artificial light, and it may be visible or invisible light.

Furthermore, the first semiconductor circuit may include other circuits or elements, such as a MOSFET or MOS diode. The second semiconductor circuit may include other circuits or elements, such as a MOSFET, diode, or p-type or n-type resistor. Therefore, the second semiconductor circuit used when the first semiconductor circuit is composed of MOSFETs is not necessarily to be MOSFETS, but may be diodes.

In addition, the second semiconductor circuit, as described above, produces the second current which cancels the first current produced by the first semiconductor circuit. In this case, the kind of carriers produced as the second current in the second semiconductor circuit may be the same or different kinds of carriers produced as the first current in the first semiconductor circuit. That is, when the first semiconductor circuit produces electrons due to external light, the second semiconductor circuit may produce electrons or holes. On the contrary, when the first semiconductor circuit produces holes due to external light, the second semiconductor circuit may produce holes or electrons. For example, when the first semiconductor circuit is an n-type MOSFET, surplus electrons are produced by irradiation of external light. In this case, the second semiconductor circuit may be, for example, an n-type MOS element or p-type MOS element, so that carriers produced by such an element due to external light cancels the influence (influence on a circuit operation) of the above electrons produced by the n-type MOSFET.

Further, when at least one first semiconductor circuit in a plurality of first semiconductor circuits formed in the semiconductor device is not substantially influenced in a circuit operation by carriers produced due to irradiation of the external light, the first semiconductor circuit is not required to be provided with the second semiconductor circuit. Also, in the case where a plurality of first semiconductor circuits is formed in the semiconductor device, one second semiconductor circuit is not necessarily provided with one first semiconductor circuit. For example, currents produced by plural first semiconductor circuits when irradiated by the external light, may be canceled by the current produced by one second semiconductor circuit. On the contrary, a current produced by one first semiconductor circuit may be canceled by the currents produced by plural second semiconductor circuits.

It is preferable that the first semiconductor circuit according to the present invention increases voltage due to the first current, and that the second semiconductor circuit decreases voltage due to the second current.

When the voltage fluctuation originating from the first current in the first semiconductor circuit is increased, the second semiconductor circuit may be formed to lower the increased voltage. This method prevents the voltage fluctuation in the first semiconductor circuit to maintain the voltage to be constant, so that a malfunction in the first semiconductor circuit can be prevented.

Additionally, it is preferable that the first semiconductor circuit according to the present invention decreases voltage due to the first current and that the second semiconductor circuit increases voltage due to the second current.

When the voltage fluctuation originating from the first current in the first semiconductor circuit is decreased, the second semiconductor circuit may be formed to raise the decreased voltage. This method prevents the voltage fluctuation in the first semiconductor circuit to maintain the voltage to be constant, so that a malfunction in the first semiconductor circuit can be prevented.

Moreover, the second semiconductor circuit in accordance with the present invention is preferably disposed adjacent to the first semiconductor circuit.

When the external light does not irradiate the first semiconductor circuit evenly, the first semiconductor circuit should be located as close as possible to the second semiconductor circuit. This causes the second current to be substantially equal to the first current to ensure the cancellation. However, when the external light is irradiated evenly, the first semiconductor circuit need not be necessarily located close to the second semiconductor circuit for canceling the carriers generated by light excitation in the first semiconductor circuit.

Additionally, it is preferable that the first semiconductor circuit of the present invention may include a high resistance circuit.

In a high resistance circuit, the magnitude of a drive current flowing through the circuit inevitably becomes small. Therefore, when the second semiconductor circuit is not formed, the current which is increased in the circuit becomes large under the influence of the first current, resulting in frequent malfunctions. Then, in the present invention, malfunction based on an overcurrent in a high resistance circuit can be prevented by connecting a second semiconductor circuit to such a high resistance circuit which tends to cause malfunction and by canceling a first current with a second current to reduce the first current due to light excitation in the first semiconductor circuit, i.e., in the high resistance circuit.

Moreover, the first semiconductor circuit according to the present invention preferably includes an operational amplifier. Further, the second semiconductor circuit is preferably connected to an output terminal of the operational amplifier.

When the first semiconductor circuit is composed of an operational amplifier, malfunction of the operational amplifier can be prevented by forming the second semiconductor circuit at its output terminal to cancel the first current in the operational amplifier with the second current.

Furthermore, it is preferable that the first semiconductor circuit according to the present invention further includes a voltage dividing resistance formed at the output terminal of the operational amplifier, and the second current with a magnitude to cancel the voltage fluctuations due to the first current and a current generated at the voltage dividing resistance.

When the output terminal of the operational amplifier is provided with a plurality of resistances, the current which is, in addition to the drive current and the first current, increased due to the resistances is generated in the first semiconductor circuit. For this reason, it is preferred that the second semiconductor circuit have a circuit configuration in which the second current is set so as to cancel the first current and the above increment current.

Furthermore, the first semiconductor circuit according to the present invention preferably includes a dynamic type operation circuit and further charging and discharging means which are connected to an output terminal of the dynamic type operation circuit to charge and discharge current. It is preferred that the second semiconductor circuit be connected to the output terminal and be constituted so as to cause the second current to flow toward the charging and discharging means.

A holding operation is performed by charging an electric charge with the charging and discharging means connected to the output terminal in the dynamic type operation circuit. Thus, when the first current which is excited due to external light is generated in the dynamic type operation circuit during usual operation, an electric charge which is charged because of this first current in the charging and discharging means becomes insufficient. Then, the second current is caused to flow toward this charging and discharging means from the second semiconductor circuit to compensate for the insufficiency of electric charge in the charging and discharging means, so that a malfunction in the dynamic type operation circuit can be prevented.

In addition, the first semiconductor circuit according to the present invention may include switching means. Furthermore, it is preferred that the second semiconductor circuit be provided in the switching means.

When the first current is generated in the switching means, the originally intended ON/OFF operation is not performed exactly, so that various malfunctions are caused, such that an OFF operation is performed in spite of the ON state in the switching means or an ON operation is executed in spite of the OFF state in the switching means. Then, in the present invention, the second semiconductor circuit is provided in the switching means, so that the ON/OFF operation of the switching means can be performed properly and malfunctions, whereby an OFF operation is performed although it is originally intended to perform an ON operation, or an ON operation is performed although it is originally intended to perform an OFF operation.

Additionally, the switching means according to the present invention is preferably formed of a plurality of transmission gates. Further, it is preferred that the second semiconductor circuit be provided in each of the plural transmission gates.

Therefore, second semiconductor circuits are formed for each of the transmission gates, so that stepwise ON/OFF control can be performed.

Furthermore, it is preferred that the second semiconductor circuit according to the present invention be composed of a junction diode.

The second current can be produced by using a simple element such as a junction diode. As a result, it is possible to form the second semiconductor circuit without a complex circuit configuration to contribute to high integration for semiconductor circuit with a reduced occupation area.

In addition, the first semiconductor circuit according to the present invention preferably includes at least one first conductive type transistor. Further, the second semiconductor circuit preferably include at least one second conductive type transistor with conductivity opposite to that of the first conductive type transistor. In addition, it is preferred to form a complementary relationship between the first and second conductive transistors.

When the first semiconductor circuit is a first conductive type transistor, the first conductive type transistor and the second semiconductor circuit to cancel the carriers generated by light excitation of the first conductive type transistor can be formed as a CMOS structure. That is, one CMOS operates as the first semiconductor circuit and the other operates as the second semiconductor circuit.

As an aspect of the present invention, a semiconductor device may comprise a first element of a second conductive type which is formed in a first region of a first conductive type formed in a semiconductor substrate and includes a gate electrode, a source region of a first impurity region of a second conductive type and a drain region of a second impurity region of the second conductive type, the source and drain regions are electrically connected to the first region and has a conductivity opposite to the first region. Further, the semiconductor device comprises a second element which is formed in the semiconductor substrate and includes at least a third impurity region of the first conductive type formed in the vicinity of the first region, the third impurity region being electrically connected to at least the first region.

When the first element is irradiated by external light from the rear side of the semiconductor substrate, carriers are generated in the first region. In addition, carriers are also generated in the third impurity region of the second element. The carriers generated in the first element can be canceled by the carriers in the second element by electrically connecting the first region and the third impurity region. As a result, even when the first element is irradiated by external light, a current in the first element due to the carriers generated in the first element is prevented, so that a malfunction in the first element itself and periphery circuits connected to the first element can be prevented.

At this time, in the first element; although carriers are generated toward both the first impurity region and the first region, these carriers cancel each other in the first region, so that the generation of carriers at junctions of the first and second impurity regions and the first region need not be taken into consideration.

Furthermore, it is necessary to set up groove depths of the first region and the third impurity region so as to cancel each other based on the external light from the front and rear sides of the semiconductor substrate and on spectral sensitivity characteristics corresponding to the kind of external light.

In addition, in the present invention, an external light preferably irradiates from one side of the semiconductor substrate in which the first, second, and third impurity regions are not formed. Further, the first element of the second conductive type is preferably ormed with an n-type transistor. It is preferred that the third impurity region in the second element is formed to be larger than the first or second impurity region in the first element of the second conductive type.

Voltage fluctuation can be prevented without producing an excessive current in the first element by making the carriers generated in the second element greater than or substantially equal to the carriers generated in the first element.

Additionally, in the present invention, an external light preferably irradiates from one side of the semiconductor substrate in which the first, second, and third impurity regions are not formed. Further, the third impurity region in the second element is preferably formed to be such a size that the amount of carriers produced in the third impurity region due to the external light is substantially equal to the amount of carriers produced in the first or second impurity region in the first element of the second conductive type.

This can certainly and substantially cancel the carriers in the first element with the carriers in the second element to prevent voltage fluctuation.

Furthermore, in the present invention, a distance between the third impurity region and the second impurity region is preferably formed in the minimum size under the design rules.

In the cross section structure, the small size of the layout area provides a semiconductor device which is compact, low cost, and has a significantly small chip area.

In addition, the third impurity region of the present invention is preferably formed like a ring around the first and second impurity regions.

Also in the planar structure, the small size of the layout area can realize the optimal shape of the second element to contribute to the small size of the chip area.

Furthermore, in the present invention, an external light preferably irradiates from one side of the semiconductor substrate in which the first, second, and third impurity regions are not formed. Additionally, the first element of the second conductive type is preferably formed with an p-type transistor. Further, the third impurity region in the second element is preferably formed to be smaller than the first or second impurity region in the first element of the second conductive type.

When the first element is formed with the first conductive type, this can make the amounts of carriers generated in the first and second elements substantially equal to perform the cancel operation well.

A liquid crystal display device according to the present invention comprises a liquid crystal display panel including a transparent or translucent substrate. Further, it includes the semiconductor device described above which is formed on the same substrate as the liquid crystal display panel.

When a semiconductor device is formed with a semiconductor chip or the like, the semiconductor device is mounted on a transparent or translucent substrate. In this way, the semiconductor device can be applied to the liquid crystal display device, even when it is mounted on a transparent or translucent substrate.

A liquid crystal display according to the present invention incorporates the semiconductor device described above in a liquid crystal drive circuit which drives pixel electrodes disposed in a matrix-like pattern of a liquid crystal display panel.

Although the semiconductor device described above is to be placed on a substrate, when the substrate is composed of materials suitable for forming a semiconductor layer (such as glass or the like), the semiconductor device is formed directly on the substrate. In this manner, the liquid crystal display device applying the semiconductor device described above can be provided, even when the semiconductor device is formed directly on the substrate.

Note that the semiconductor devices incorporated in a liquid crystal drive circuit are preferably applied to high resistance circuits managing analog signals, such as a power supply circuit, A/D converter, regulator, operational amplifier, DRAM, and SRAM.

The electronic equipment according to the present invention comprises the above described liquid crystal display. This allows malfunctions resulting from voltage fluctuation due to light, such as transformation of characters displayed or halting of an oscillation circuit, to be prevented, thereby providing electronic equipment usable in strong sunlight in summer or under fluorescent lamps.

BRIEF DESCRIPTION OF THE DRAWINGS

FIG. 2A is a cross-sectional representation of the structure of an n-type MOSFET in the power supply circuit in FIG. 1;

FIG. 2B is a cross-sectional representation of the structure of the carrier cancel element in the power supply circuit in FIG. 1;

BEST MODE FOR CARRYING OUT THE INVENTION

The embodiments where the present invention is applied to a power supply circuit will hereinbelow be described specifically with reference to the accompanying drawings.

Embodiment 1

Circuit Configuration

Figure 1:
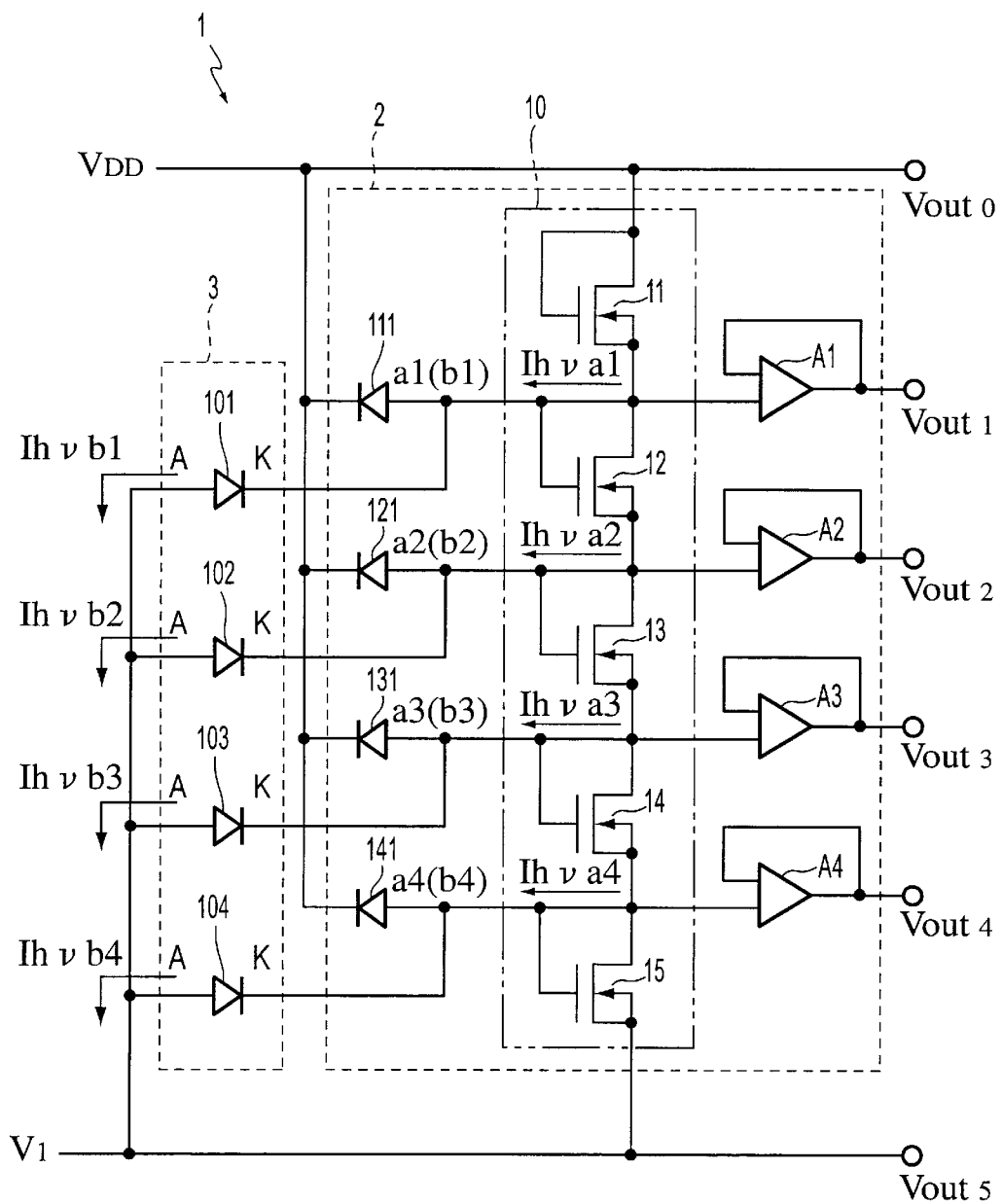
FIG. 1 is a circuit diagram of a power supply where a pn junction between an n-type substrate region and p-type well region is taken into consideration, showing one embodiment of the semiconductor device according to the present invention.
Figure 19A:
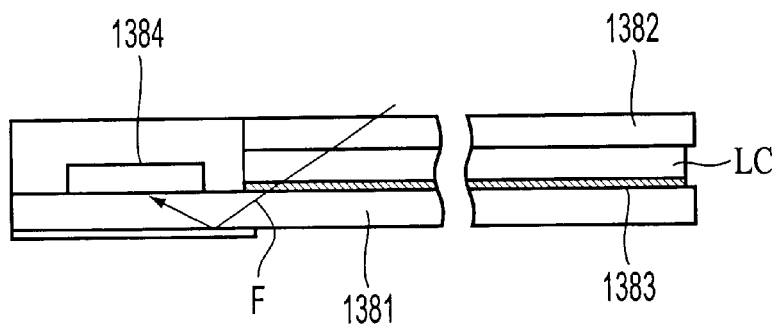
FIG. 19A is an illustration showing a forming state of a drive circuit of a conventional COG type of a liquid crystal display.
Figure 19B:
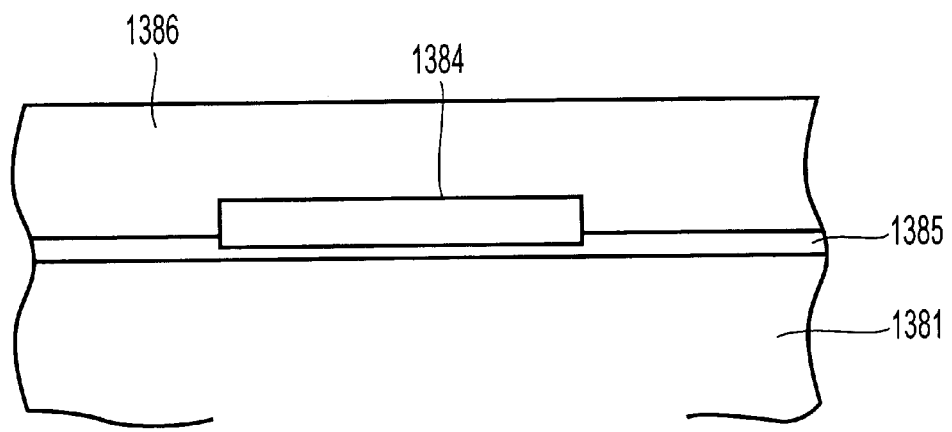
FIG. 19B is an enlarged view of the power supply circuit in FIG. 19A.
Figure 20A:
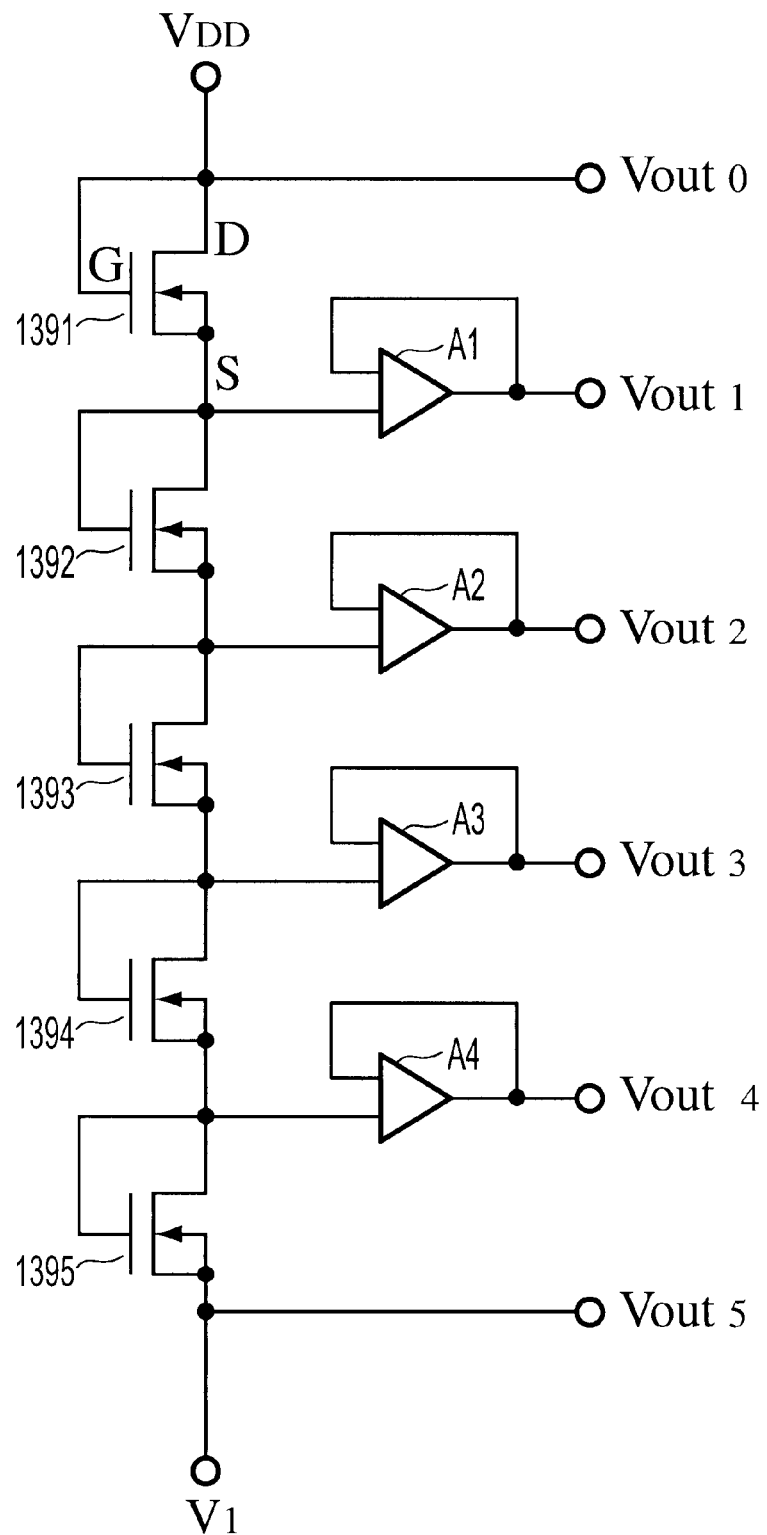
FIG. 20A shows a conventional power supply circuit.
Figure 20B:
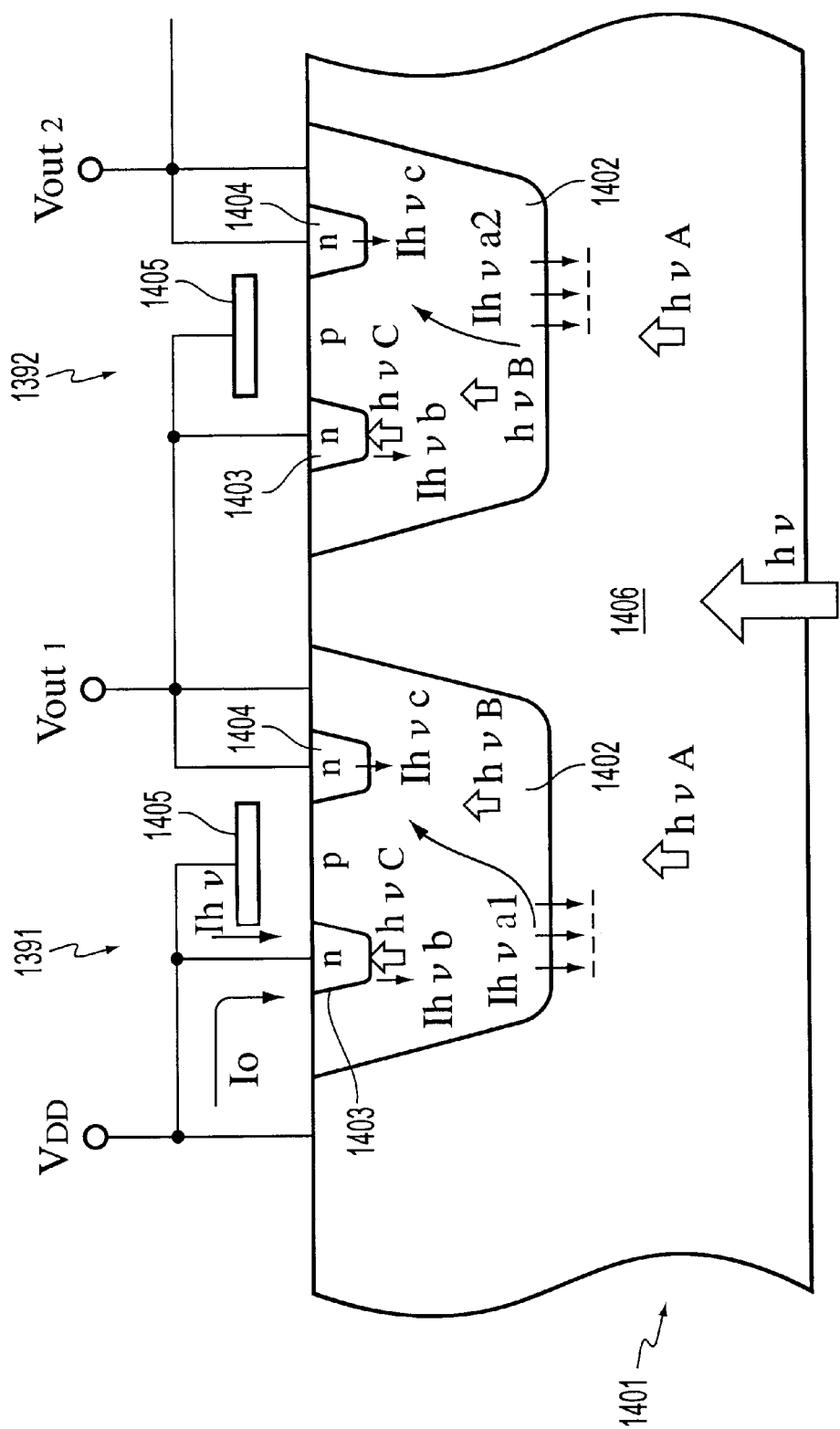
FIG. 20B is a partial illustration of the power supply circuit in FIG. 20A.
Figure 21A:
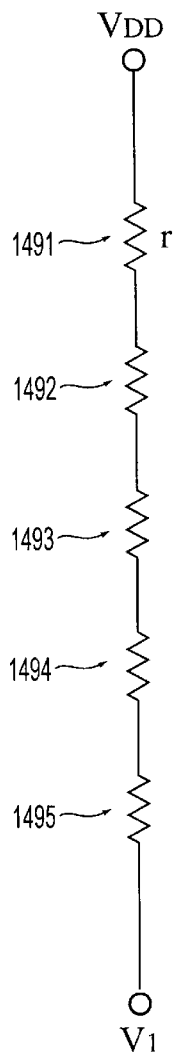
FIG. 21A is a circuit diagram showing an equivalent circuit of the power supply circuit in FIG. 19A when light is not being shone.
Figure 21B:
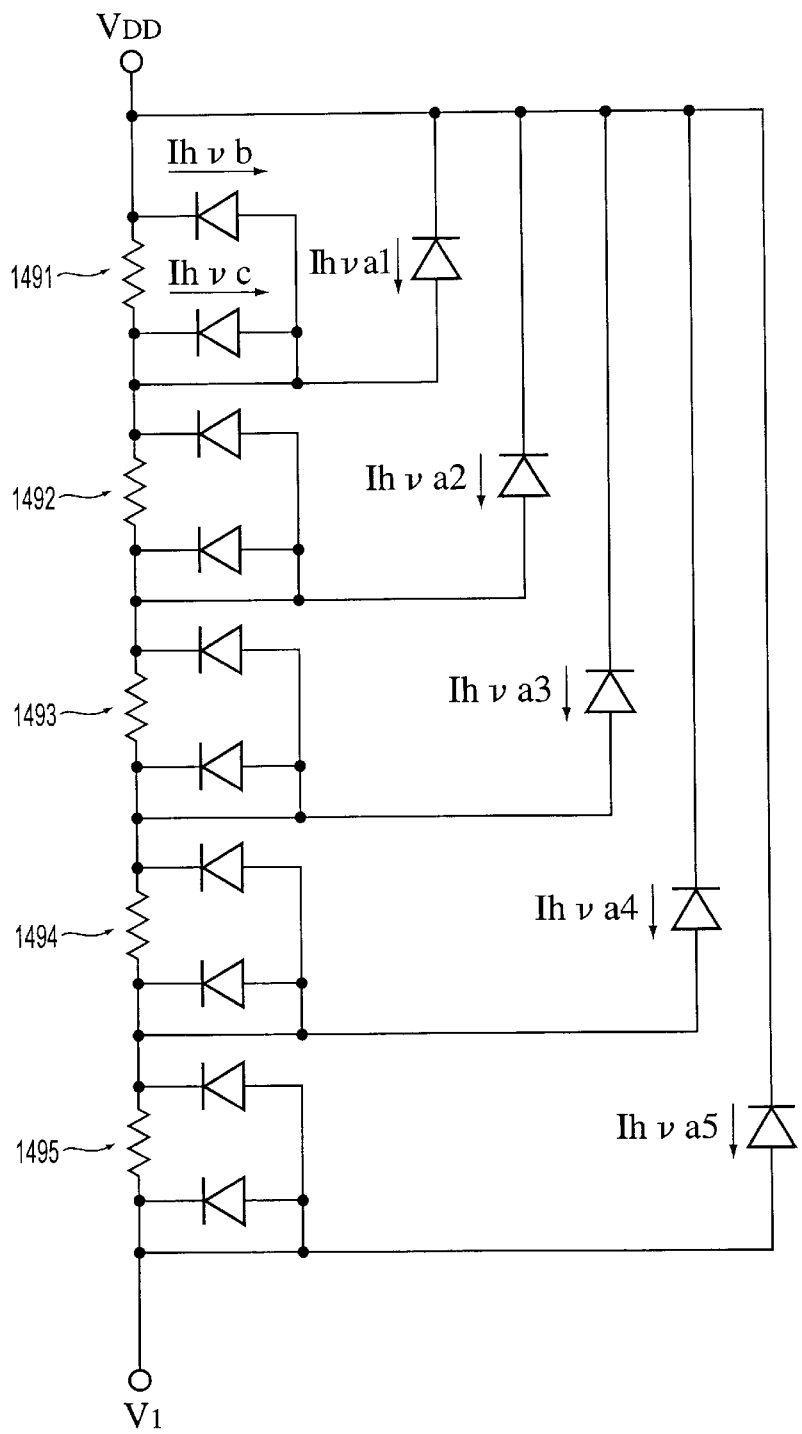
FIG. 21B is a circuit diagram showing an equivalent circuit of the power supply circuit when light is shone.

FIG. 1 is a circuit diagram showing an example where the semiconductor device according to the present invention is applied to a power supply circuit in a liquid crystal drive circuit. In this example, the power supply circuit is, as in FIGS. 19A and 19B, formed on a glass substrate.

The power supply circuit 1 of this example, as shown in FIG. 1, roughly comprises a first semiconductor circuit 2 and a second semiconductor circuit 3 which is electrically connected to the first semiconductor circuit 2.

The first semiconductor circuit 2 produces first currents Ihva (Ihva1 to Ihva4) which are excited by an external light, and comprises a multistage connection circuit 10 in which a plurality of, for example five, first elements which functions as resistors in a high resistance circuit, that is, n-type MOSFETs 11 to 15 as semiconductor elements for a principal circuit are connected in multistage and a plurality of, for example four, voltage follower circuits A1 to A4 which are connected between the source and drain of each of n-type MOSFETs 11 to 15 and output terminals from which voltages Vout1 to Vout4 are output. Incidentally, in the circuit of FIG. 1, for convenience of discussion, np junctions between n-type substrate and p-type well region of each of the MOSFETS 11 to 14 are designated by diodes 111, 121, 131, and 141. A cross section structure including these will be explained later.

The second semiconductor circuit 3 produces second currents Ihvb (Ihvb1 to Ihvb4) to cancel a part or all of the voltage fluctuation produced by the current increment of the first currents Ihva (Ihva1 to Ihva4) during irradiation by the external light, and comprises a plurality of, for example four, second elements, that is, diodes 101 to 104 as carrier cancel elements. Incidentally, the second currents Ihvb (Ihvb1 to Ihvb4) are excited based on the external light same as which produces the first currents Ihva (Ihva1 to Ihva4).

Furthermore, although the power supply circuit 1 in this example adopts a configuration where, for example, six levels of voltages Vout0 to Vout6 are output in order to drive a liquid crystal display panel using the voltage drop method, however, depending on the size of the liquid crystal display panels, the first semiconductor circuit 2 and second semiconductor circuit 3 can be formed to output various voltage levels.

Further, the liquid crystal drive circuit can be constituted so that a bias voltage can be changed under a reduced current state by making the n-type MOSFETs 11 to 15 a high resistance circuit in order to reduce the power consumption.

In addition, as current flows in only one channel out of the three channels in the MOSFETs 11 to 14, the same characters can be collected at one terminal.

Incidentally, as the current flows only when light is shone, under external light, such as fluorescent lamps, the brightness is approximately 700 lx, so that the light excited current is not increased. When the flash of a camera occurs or a liquid crystal display panel is brought to just below the fluorescent lamps, the brightness is approximately 50,000 lx, and under a sunbeam, the brightness is approximately 100,000 lx. In these cases the light excited current may flow. Therefore, it is sufficient that a malfunction is prevented only when strong light is shone. On the contrary, in the case of weak light, a liquid crystal display panel is invisible, so that countermeasures are not required.

The bias voltage VDD is applied to one end of the multistage connection circuit 10 and V1 is applied to the other end. Also, the voltages Vout0 and Vout5 are output from both ends of the multistage connection circuit 10. The voltages Vout1 to Vout4 are output through voltage follower circuits A1 to A4 from between the source of the MOSFET 11 and the drain of the MOSFET 12, between the source of the MOSFET 12 and the drain of the MOSFET 13, between the source of the MOSFET 13 and the drain of the MOSFET 14, and between the source of the MOSFET 14 and the drain of MOSFET 15.

Incidentally, as will be explained in FIG. 2A, each of the MOSFETs 11 to 14 is constituted so that a p-type well region is formed in an n-type substrate and, further, an n-type drain region and an n-type source region are formed in this p-type well region. Also, in this embodiment, as will be explained in FIG. 2B, the diodes 101 to 104 which serve as carrier cancel elements made by forming n-type regions in the p-type well regions and correspond to the MOSFETs 11 to 14, respectively, are provided.

In FIG. 1, each of the cathodes K of the diodes 101 to 104 is connected to the input terminal of each of the voltage follower circuits A1 to A4, and each of the anodes A is connected to the V1 terminal.

About Cross Section Structure

FIGS. 2A and 2B are cross-sectional views showing structures of the MOSFETs and carrier cancel elements in the power supply circuit described above. In FIG. 2A, the MOSFET 11 is formed in an n-type substrate 28. P-type well regions 22 are formed in the n-type substrate 28, and n-type drain regions 23 and n-type source regions 24 are formed in these p-type well regions 22. Additionally, gate electrodes 25 are formed through insulation layers, not shown, which gate electrodes 25 are above and between the n-type drain regions 23 and n-type source regions 24. VDD is applied to the gate electrode 25, n-type drain region 23, and n-type substrate 21 of the MOSFET 11 This VDD is connected to the output terminal of Vout0, and the n-type source region 24 of the MOSFET 11 and the n-type drain region 23 of the MOSFET 12 are connected to the output terminal Vout1.

As for the connections between the MOSFET 12 and the MOSFET 13, between the MOSFET 13 and the MOSFET 14, and between the MOSFET 14 and the MOSFET 15, as with the connection between the MOSFET 11 and the MOSFET 12, the n-type source electrode of the front stage MOSFETS is connected to the n-type drain region and the gate electrode of the rear stage MOSFETS. Further, each connection line of MOSFETs is connected to the output terminals Vout2 to Vout4 through the voltage follower circuits A2, A3, and A4.

FIGS. 2A and 2B show when external light with an energy of hv is irradiated on to the rear side of the n-type substrate 21.

In addition, the output voltage (Vout2 to Vout4) terminals to A2, A3, and A4, and terminals a2 to a4, in which the diodes 102 to 104 shown in FIG. 2B are connected to cathode terminals b2 to b4, are pulled out from each line.

FIG. 2B shows that the diodes 101 to 104 are formed in the n-type substrate 21. Each of the diodes 101 to 104 is made by forming an n-type region in the p-type region 26. Voltage V1 is applied to each p-type region 26 (i.e., each anode A of the diodes 101 to 104), and the terminals b1 to b4 (which are connected to the terminals a1 to a4 in FIG. 2A) are pulled out from each n-type region (cathodes K of diodes 101 to 104 in FIG. 2A).

Next, the flow of the current (carriers) based on the light excitation when light is shone will be explained.

In FIG. 2A, when the external light hv is shone on to the rear side of the n-type substrate 21, for example in the MOSFET 11, a bias current Ibias tends to increase by the current Ihva1 as the first current due to light excitation by electrons generated in the p-type well region 22. On the other hand, the external light hv also irradiates the diodes 101 to 104 shown in FIG. 2B. By this external light hv, electrons are generated in the p-type well region 26 to produce the current Ihvb1 as the second current, for example, in the diode 101.

At this time, as shown in FIG. 2A, when the current Ihva1 is generated in the p-type well region 26 in the n-type MOSFET 11, the current Ihva1 flows toward a node a1 (b1), so that the potential of, for example, the node a1 (b1) tends to increase by the current increment. On the other hand, when the current Ihvb1 is generated in the p-type well region 26 of the diode 101, as shown in FIG. 2B, the current Ihvb1 flows from the anode A of the diode 101 to V1. That is, in the circuit diagram in FIG. 1, by causing the current to flow Ihva1 from the n-type MOSFET 11 to the node a1 (b1), although the potential of the node a1 (b1) rises, by the flow of the current Ihvb1 from the anode A in the diode 101, the potential of the node a1 (b1) is lowered.

Therefore, when the current Ihva1 is substantially equal to the current Ihvb1, the current Ihvb1 acts as if canceling the current Ihva1. As a result, the potential of the node a1 (b1) can be maintained at a stable because of constant potential without fluctuation, and even when the current Ihva1 due to light excitation is produced in the MOSFET 11, the potential of the output terminal Vout1 can be made stable to always maintain the desired potential value.

Similarly, even when light excited currents Ihva2 to Ihva4 are generated in the MOSFETs 12 to 14, each potential of the nodes a2 (b2) to a4 (b4) can be maintained constant by the light excited currents Ihvb2 to Ihvb4 produced in the diodes 102 to 104. Therefore, as the potentials of the output terminals Vout1 to Vout4 can be maintained constant, the potential of, for example, scan lines or data lines of a liquid crystal display panel connected to the output terminals Vout1 to Vout4 can be raised constantly, regardless of light irradiation, to drive the liquid crystal display panel well.

About the Position in the Cross Section of the Carrier Cancel Element

Next, some considerations to specify the positional relationship in the cross section between the diode 101 and the MOSFET 11 will be explained. It is preferred that the positions of the diodes 101 to 104 be arranged close to the MOSFETS 11 to 14. The reason is that, when the diode 101 is formed at a distance from the position where the MOSFET 11 is formed, the diodes 101 and MOSPET 11 are not irradiated by the same kind of light with the same light intensity and spectral sensitivity characteristics, so that the current Ihva1 can not be formed substantially equal to the current Ihvb1, making it impossible to cancel the voltage fluctuation. Therefore, both elements are preferably arranged within the range of the external light to be shone, and more preferably arranged in the same position.

Figure 3A:
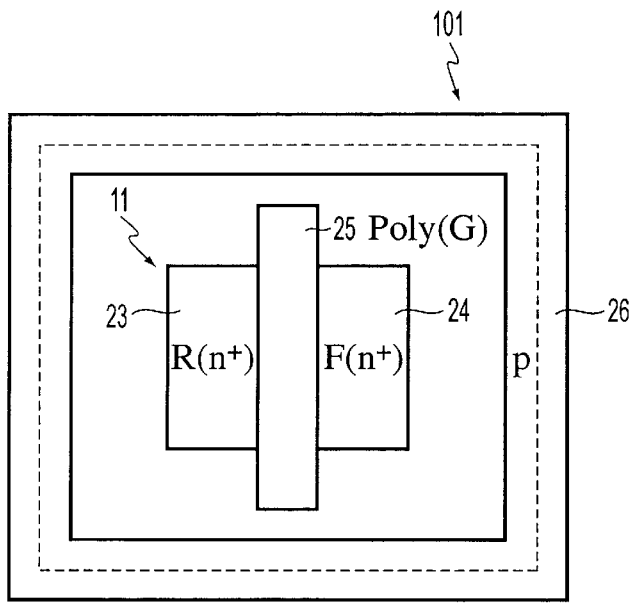
FIG. 3A is a plan view of another embodiment of the structure of the power supply circuit in FIG. 1, showing the layout of the structure.
Figure 3B:
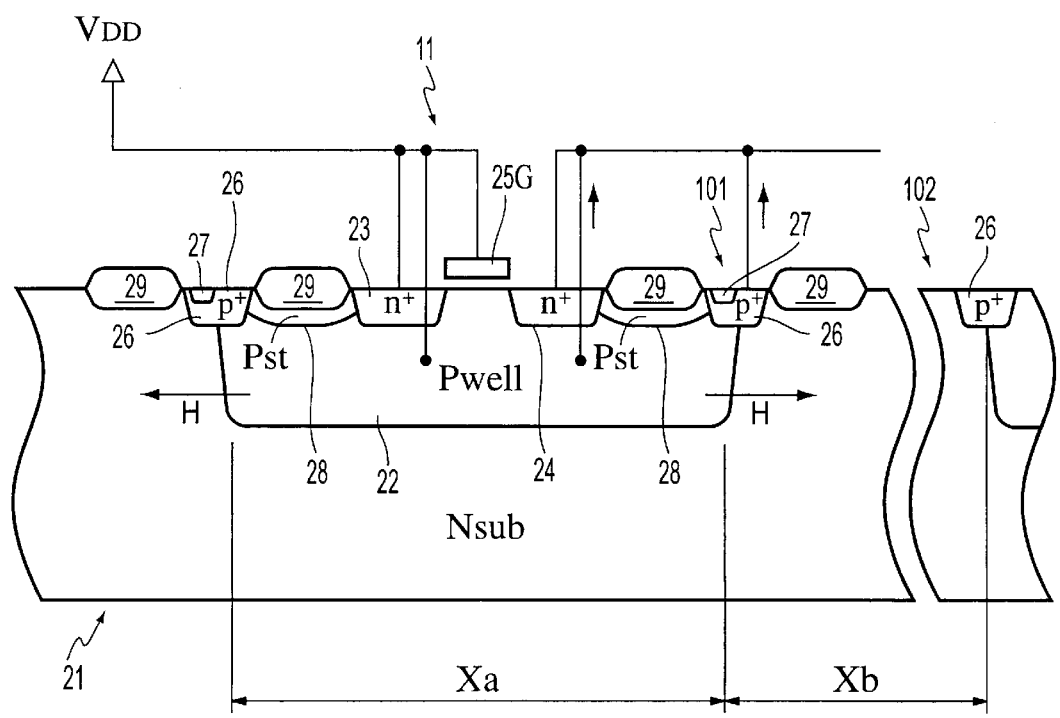
FIG. 3B is a cross-sectional view of the cross-sectional structure corresponding to FIG. 3A.

One example where the diode 101, which is the second element and serves as a carrier cancel element, is formed in the vicinity of the MOSFET 11 is shown in FIG. 3A and 3B.

As shown in a cross-sectional view in FIG. 3B, the p-type well 22 is formed in the n-type semiconductor substrate 21. In the p-type well 22, the n-type drain region 23 and n-type source region 24, which are high impurity density regions, and n+ type impurity layers are formed in a spaced relation. And, on the surface of the n-type semiconductor substrate 21, field oxide layers 29 for separating elements are formed in a spaced relation. In a region which is above the p-type well 22 and specified by the field oxide layer 29, the polysilicon gate electrode (G) 25 is formed with a floating gate through an insulation layer. Moreover, at the rear face of the field oxide layer 29, a channel stop layer Pst 28 is formed as the reverse stop impurity layer.

The diode 101 is composed of an n-type region 27, which is an n+ type impurity layer, and a p-type region 26. Wire is formed on the gate electrode 25. As shown in FIG. 3, the n-type drain region 24 and the p-type well region 24 of the MOSFET 11 and the p-type region 26 of the diode 101 are electrically connected by wire.

In addition, the p-type region 26 of the diode 101 is formed at a position which is the main face of the n-type semiconductor substrate 21 in the MOSFET 101 and is a boundary face between the p-type well region 22 and the n-type semiconductor substrate 21. By forming in such a positional relation, each of the p-type region 26 of the diode 101 and the p-type well region 22 of the MOSFET 11 can be irradiated by the same kind of light, so that the current Ihva1 and the current Ihvb1 described above can be made substantially equal to surely prevent the voltage fluctuation.

This structure can be fabricated in the following sequential steps of: forming a p-type well region 22 in an n-type semiconductor substrate 21, forming n+ type impurity layers 23 and 24 in the p-type well region 22, forming a p+ type impurity layer 26 at the boundary between the p-type well region 22 and the n-type semiconductor substrate 21, forming an insulating layer on the semiconductor substrate 21, and forming a floating gate (G) 25 on the insulating layer. More specifically, forming the n+ type impurity layers 23 and 24 by the ion implantation method in the p-type well region 22, forming the p+ type impurity layer 26 by the same method, forming an interlayer insulating layer on the semiconductor substrate to cover a control gate (G) 25 and the n+ type impurity layers 23 and 24, and selectively removing the interlayer insulating layer to expose the control gate (G) 25, the n+ type impurity layers 23 and 24, and the p+ type impurity layer 26. Then, wire is formed to electrically connect the n+ type impurity layer 24, the p+ type impurity layer 26, and the p-type well region 22.

Note that, the steps described above can be set independent of an n-type or p-type semiconductor substrate and rear or front irradiation of the external light. That is, when a p-type semiconductor substrate is used, the point is that n-type region of a diode is formed on a principal face of the p-type semiconductor substrate and at the boundary region between an n-type well region and a p-type semiconductor substrate.

About Planar Structure and Layout

According to this example, the layout area for MOSFET can be reduced significantly by minimizing the distance Xb between the mutually adjacent diodes 101 and 102 which serve as the carrier cancel elements, the distance between the n-type source region 24 and the p-type region-26, and other relevant distances, shown in FIG. 3B, based on the design rules, while securing a high ESD withstand voltage. As a result, a compact and low-cost semiconductor device becomes available. Particularly, the smaller layout area decreases the chip area significantly.

Figure 15:
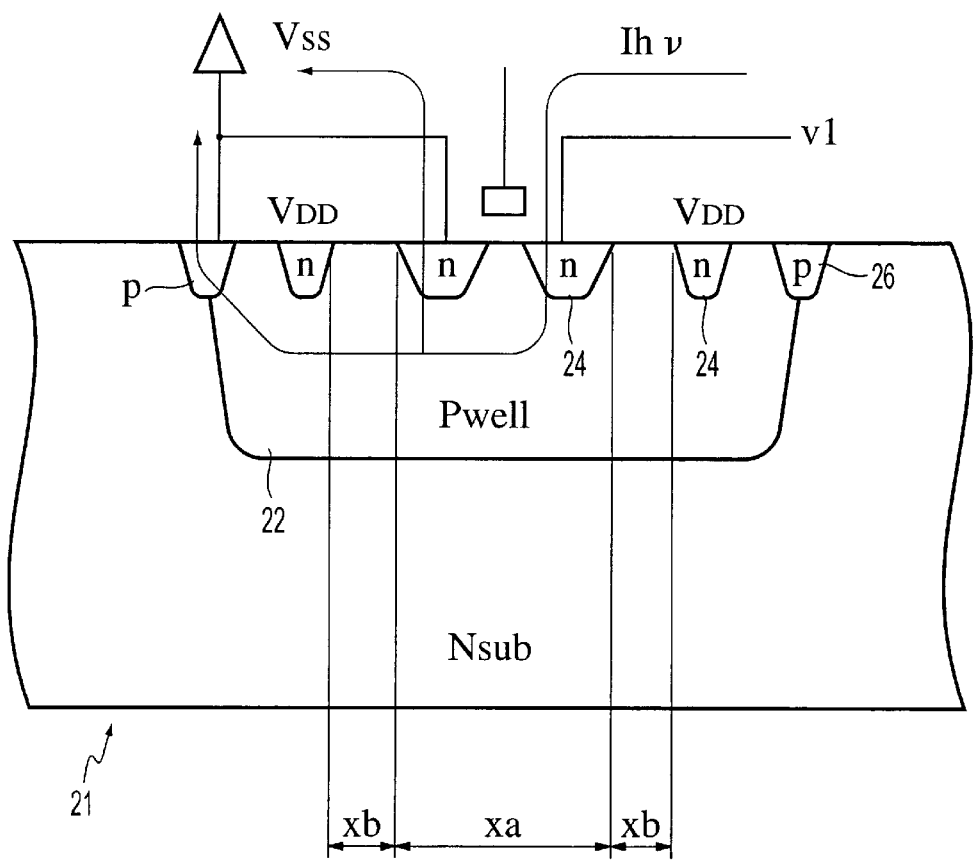
FIG. 15 is a cross-sectional view for explaining a cross section structure of a carrier cancel element and MOSFET in the power supply circuit.

In particular, in order to respond to the layout, it is desirable that the p-type region 26 of the diode 101 formed at the boundary between the p-type well region 22 and the n-type semiconductor substrate 21 be formed like a ring around the MOSFET 11, as shown in FIG. 3A. Additionally, it is also desirable that the distances Xa and Xb, shown in FIG. 3A, of the ring-like p-type region 26 be as short as possible. Furthermore, it is preferred that the light-excited carriers hb be moved as much as possible toward the guard ring of the p-type well region 22 (in the direction of the arrow H in the cross-sectional representation of FIG. 3B). However, when the potential of the p-type well region is equal to that of the n-type semiconductor substrate, Xb is preferably short to the extent that parasite PNP bipolar transistors are not switched ON by incident light. In addition, it is preferable that at the boundary between the n+ region and the p-type well region, the n+ light guard rings Xa and Xb shown in FIG. 15 be as short as possible.

About the Size of the Carrier Cancel Element on a Cross Section

Next, some considerations to specify the structure of the p-type region 26 of the diode 11 (the area, groove depth, etc. of the p-type region 26) will be explained.

The diodes 101 to 104 are determined in consideration of the sizes of the p-type well region and n-type region of MOSFETs 11 to 14. The diodes 101 to 104 are usually so designed that the currents Ihvb1, Ihvb2, Ihvb3, and Ihvb4 are substantially equal to the currents Ihva1, Ihva2, Ihva3, and Ihva4, respectively.

In other words, it is preferable that both spectral sensitivity characteristics be substantially equal in order to cause the currents Ihvb1 to Ihvb4 to be substantially equal to the currents Ihva1 to Ihva4.

This reason will be explained with reference to the cross-sectional representation of FIGS. 4A and 4B. When a vibrating light enters the silicon crystal lattice of a semiconductor substrate, light with a long wavelength (for example, 1100 to 1200 nm or more) passes through the crystal lattice and the semiconductor substrate because of its long wavelength, and does not affect the semiconductor substrate significantly. Light with a wavelength of 400 to 1100 nm collides with the crystal lattice because of its short wavelength, and is absorbed at the collision point depending upon the light absorption coefficient. Here, the light absorption coefficient is defined as a ratio indicating what percentage of light energy (wavelength) is absorbed, namely, the probability of collision of the vibrating light with the crystal lattice. Accordingly, if the upper, middle and lower layers are designated, with the top facing the incident light, the light having the short wavelength (about 400 nm) is absorbed at the top surface. Light with a wavelength of 600 nm is absorbed in the upper layer of the silicon substrate. Light having a wavelength of 800 nm is absorbed in the middle layer of the silicon substrate. Light with a wavelength of 1100 to 1200 nm passes through the silicon substrate. In this way, the substrate has the spectral sensitivity characteristics as shown in FIG. 10 in the depth direction of the pn junction.

Figures 9A, 9B:
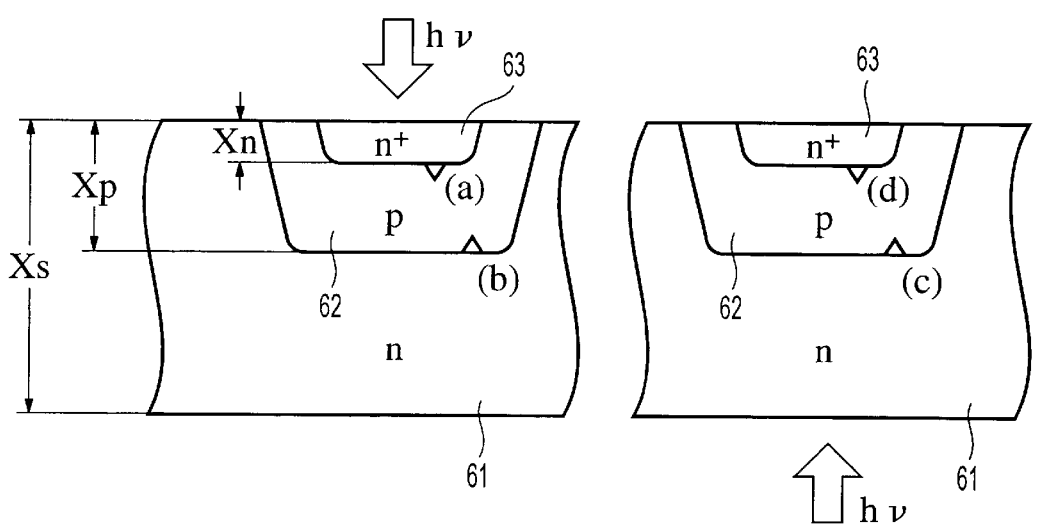
FIG. 9A is a drawing where external light irradiates the front surface of a chip constituting a layer structure in which a p-type well region is formed in an n-type substrate and an n-type region (n+) is formed in this p-type well region.
FIG. 9B is a drawing where external light irradiates from the rear surface of a chip constituting a layer structure in which a p-type well region is formed in an n-type substrate and an n-type region (n+) is formed in this p-type well region.
Figure 10:
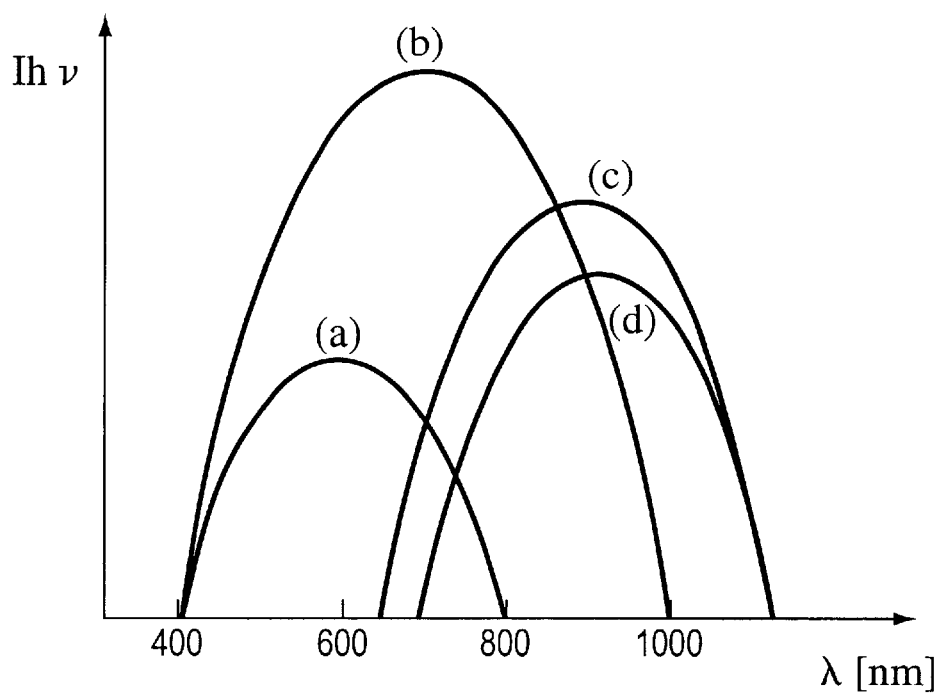
FIG. 10 is a graph showing the relationship between a wavelength λ of the absorbed external light and a current Ihv produced at this time in a semiconductor chip with the structure shown in FIGS. 9A and 9B.

Accordingly, for example, in the case of an n-type MOSFET where the p-type well region is formed on the n-type semiconductor substrate and the n-type region is formed on this p-type well region, if a light is incident on the rear side of an n-type semiconductor substrate(FIG. 9B), the light with the spectral sensitivity characteristics (d) shown in FIG. 10 is affected between the surface and the middle layer of the p-type well layer. Light having other wavelength components is not affected. In this way, the range of influential wavelength components of light depends upon whether it involves p-type, n-type, rear side irradiation, or front side irradiation, or upon the depth from the surface. Incidentally, a detailed explanation of these theories will be given later.

In consideration of this point, for example, in case of the n-type semiconductor substrate 21, when the rear side is irradiated by the external light, the spectral sensitivity characteristics differ, depending upon whether a p-type or an n-type is involved, even when the pn junction area of the n-type region 24 is equal to the pn junction area of the p-type region 26.

Figure 4A:
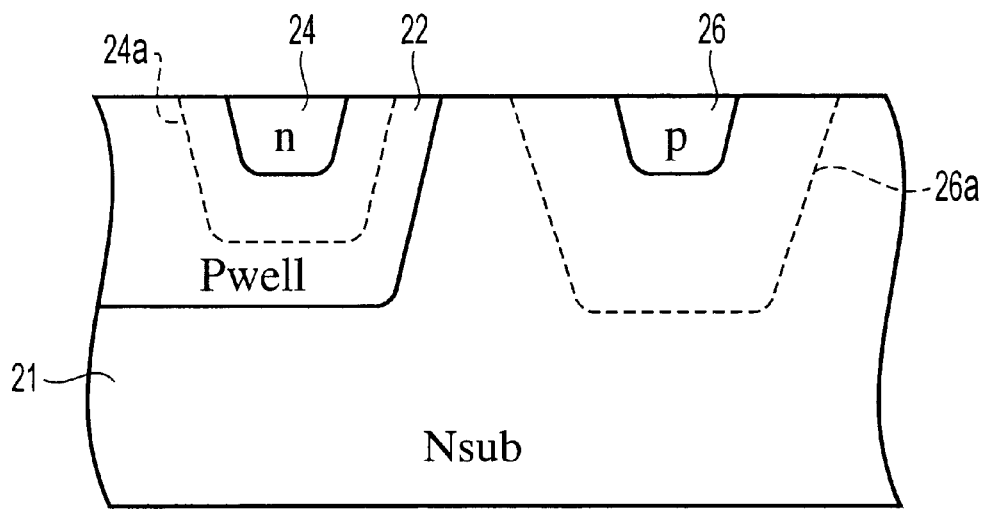
FIG. 4A is a cross-sectional view for explaining the cross-sectional structure of the carrier cancel element in the power supply circuit in FIG. 1, showing when a p+ region is equal to an n+ region.

For this reason, as shown in FIG. 4A, the spectral sensitivity of the n-type region 24 in the depth direction belongs, for example, to the light wavelength range of 400 nm, and therefore the carrier generation region 24a in the p-type well region 22 due to the n-type region 24 generated by the incidence of light is located in the middle region between the p-type well region 22 and the n-type region 24. On the other hand, the spectral sensitivity of the p-type region 26 of the diode in the depth direction belongs, for example, to a light wavelength range of about 1000 nm, and therefore the carrier generation region 26a on the n-type semiconductor substrate 21 due to the p-type region 26, as shown in FIG. 4A, is formed larger than the carrier generation region 24a. Therefore, even when the pn junction area of the n-type region 24 is equal to the pn junction area of the p-type region 26, the p-type region 26 generates more current. The same current cannot be generated and the voltage fluctuation cannot be resolved effectively.

Furthermore, the carrier generation region differs, depending also upon the type of light, for example, the wavelength of fluorescent lamps and that of incandescent lamps, and complete cancellation is difficult.

Figure 4B:
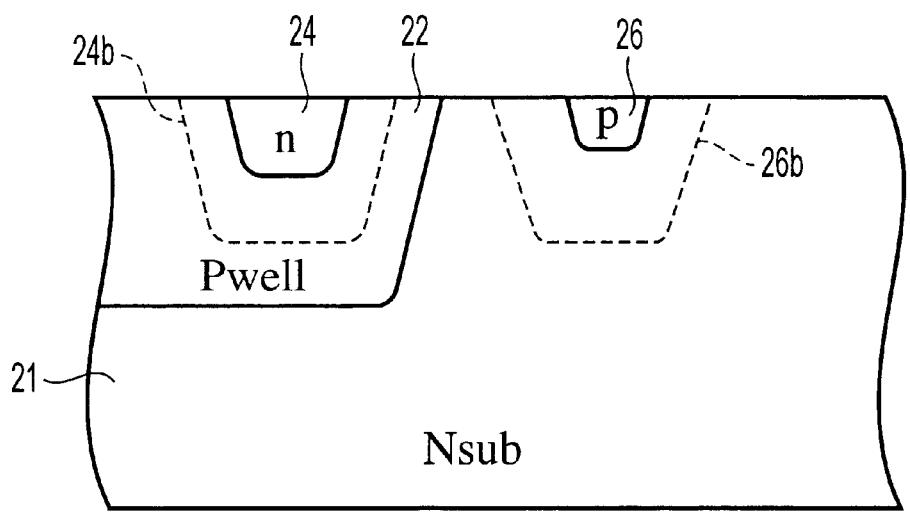
FIG. 4B is a cross-sectional view for explaining the cross-sectional structure of the carrier cancel element in the power supply circuit in FIG. 1, showing when a p+ region is larger than an n+ region.

Consequently, as shown in FIG. 4B, the size of the p-type region 26 which is formed on the n-type semiconductor substrate 21 is at least made smaller than that of the n-type (drain or source terminal) region 24 so that the spectral sensitivity characteristics of each region may be substantially equal. In other words, as shown in FIG. 4B, the size of the p-type region 26 is smaller than the size of the n+ type impurity layer so that the carrier generation region 24b of the n+ type impurity layer 24 may be substantially equal to the carrier generation region 26b of the p-type region 26. Thus, the value of current generated by the n+ type impurity layer 24 is equal to the value of current generated by the p-type cancel element 26, and complete cancellation becomes possible. Furthermore, this formation also saves space, resulting in higher area efficiency.

Additionally, in the case of rear side irradiation, and when the n-type region as a carrier cancel element is formed on the p-type semiconductor substrate, it is necessary to make the n-type region larger than the p-type region on the MOSFET, from the viewpoint of spectral sensitivity characteristics described above.

As described above, in this embodiment 1, it is possible to make the current flowing between the drain and the source of the MOSFETS 11 to 15 substantially equal. It is possible to suppress the inconvenience that the current flowing between the drain and the source of the MOSFETs 11 to 15, becomes larger at the lower stage in the conventional art. Accordingly, the voltage drop between the drain and the source of the MOSFETs 11 to 15 does not become imbalanced. It is also possible to keep the impedance of each MOSFET constant. In this way, the error of output voltage Vout0 to Vout5 can be prevented, and if any of it, it is very small.

Additionally, in this example, the diode as a carrier cancel element is formed corresponding to a number of MOSFETS, but the configuration is not limited to this example. The point is that one or more elements for generating the second current should be formed so that the increment of the first current generated by each of plural MOSFETs may be decreased.

Embodiment 2

Figure 5:
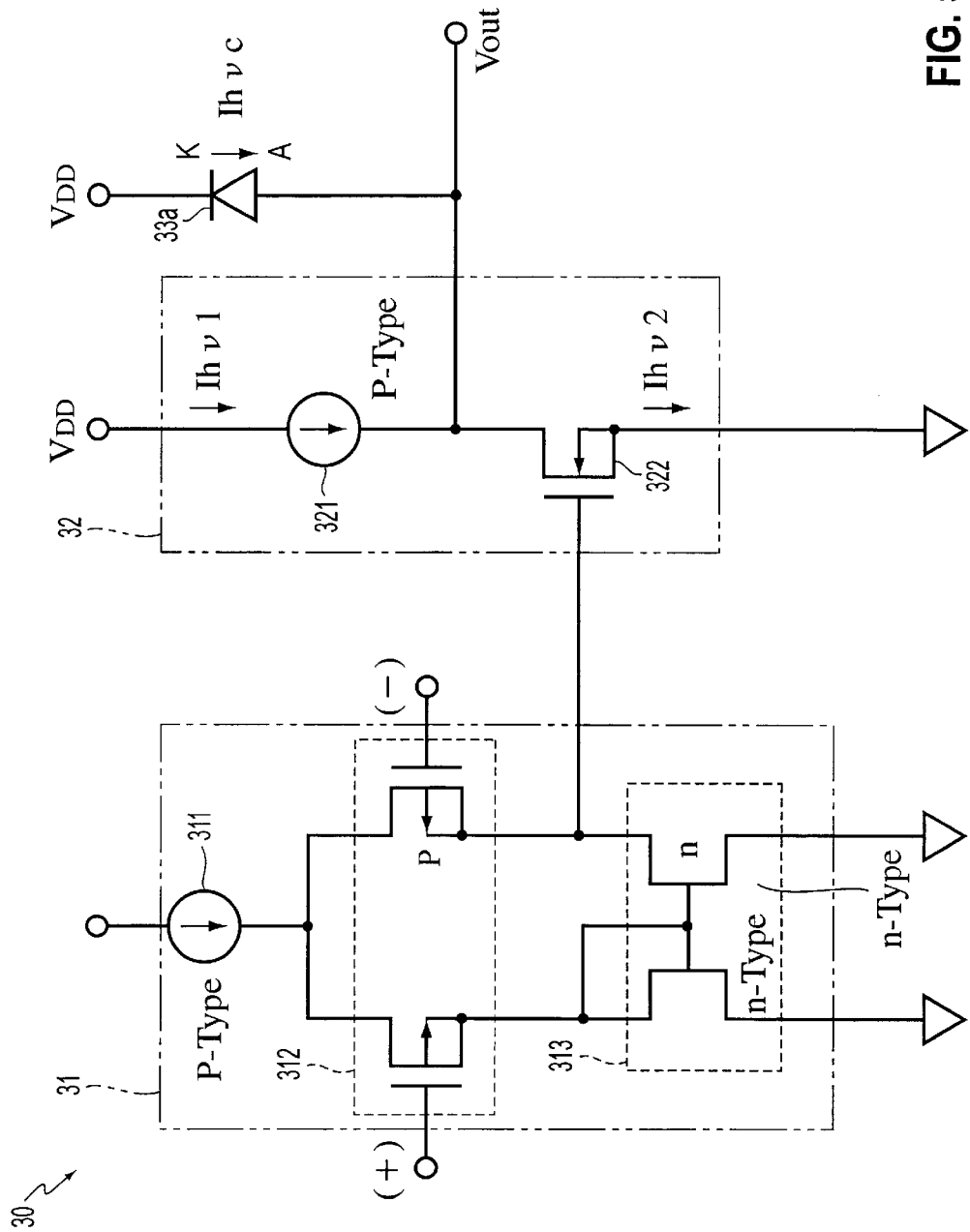
FIG. 5 is a circuit diagram showing an embodiment where the semiconductor device according to the present invention is applied to an operational amplifier in a drive circuit in a liquid crystal display.

FIG. 5 shows the embodiment 2 where this invention is applied to an operational amplifier incorporated in the crystal drive circuit. As shown in FIG. 5, the diode 33a as the second semiconductor circuit is connected to the output terminal Vout of the operational amplifier 30 as the first semiconductor circuit.

The operational amplifier 30 has a first circuit 31 and a second circuit 32. The first circuit 31 has a CMOSFET 312 and a balance circuit 313. The CMOSFET 312 has a constant current source 311, a non-reverse input terminal (+) and a reverse input terminal (−). The second circuit 32 has a constant current source (load transistor) 321 and a n-type MOSFET 322. One output terminal (FET having the non-reverse input terminal (+)) of the CMOSFET 312 is connected to the control terminal of the balance circuit 313, while the other output terminal (FET having the reverse input terminal (−)) of the CMOSFET 312 is connected to the gate of the n-type MOSFET 322. The junction point of the p-type constant current source 321 and the n-type MOSFET 322 is the output terminal Vout.

When the circuit of the configuration described above is irradiated by the external light hv, two MOSFETs of the CMOSFET 312 function so that the light excited current of one MOSFET may be canceled by the light excited current of the other MOSFET. Therefore, the influence of the external light hv described above on the light excited current is relatively small.

However, in the case where the n-type MOSFET 322, is irradiated by the external light hv, the light-excited current Ihv1 flows in the direction to increase the operating current. In case of a constant current source 321, when the external light hv is irradiated the light-excited current Ihv2 flows in the direction to increase the operating current. Incidentally, because the constant current source 321 is smaller than the n-type MOSPET 322, Ihv1 is smaller than Ihv2.

For this reason, in this example the diode 33a is formed at the output terminal Vout of the operational amplifier 30, with the anode A connected to the output terminal Vout and with the cathode K to which a voltage of the same potential as the bias voltage VDD of the current source 32 is applied. When this diode 33a is irradiated by the external light hv, it generates the light-excited current IhvC, to be supplied to the output terminal Vout of the operational amplifier 30 in this configuration.

Accordingly, when the diode 33a is not formed, the potential of 22 output terminal vout falls by the equivalent of Ihv2 and rises by the equivalent of Ihv1. However, the relation of Ihv1<Ihv2 keeps the potential drop at the equivalent of Ihv2−Ihv1. On the other hand, connection of the diode 33a cause IhvC to flow toward the output terminal Vout so that it may cancel the potential drop equivalent to Ihv2−Ihv1. Consequently, at the output terminal Vout, the voltage fluctuation due to the light excited current does not occur. Incidentally, in this case, the diode 33a should be so designed as to satisfy the equation, IhvC=Ihv2−Ihv1.

Figure 6:
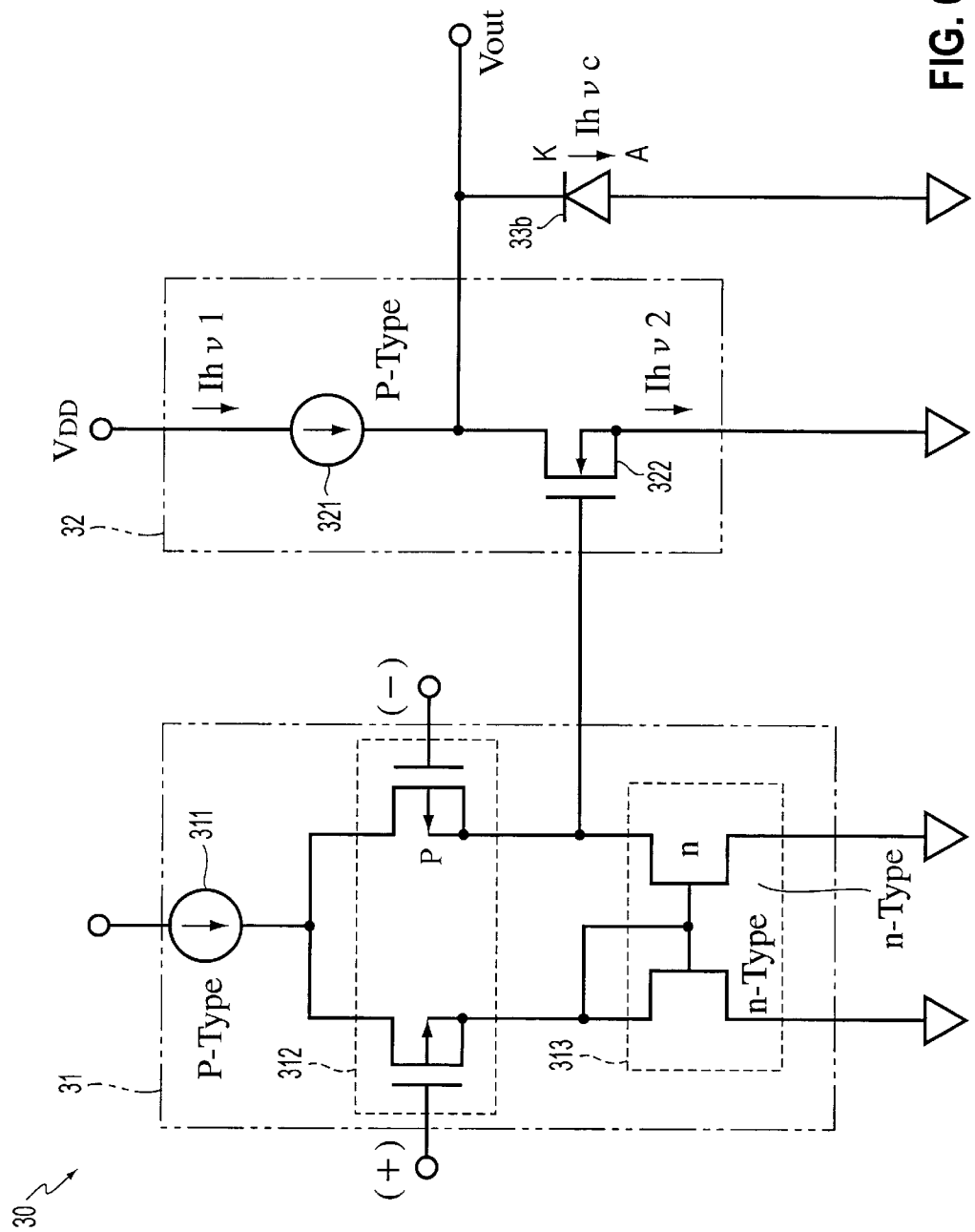
FIG. 6 is a circuit diagram showing another embodiment where the semiconductor device according to the present invention is applied to an operational amplifier in a drive circuit in a liquid crystal display.

When the relation is Ihv1>Ihv2, it is possible to design the diode 33b so that it may satisfy the equation, IhvC=Ihv1−Ihv2. In other words, in this case, the diode 33b is configured so that the cathode K may be connected to the Vout side terminal and the anode may be connected to the GND side terminal, as shown in FIG.6. In this connection, the current flows and the voltage tends to rise (fluctuate) due to the current, Ihv2−Ihv1. Even so, voltage fluctuation is prevented, because the current IhvC can suppress the voltage which tends to rise.

Embodiment 3

Figure 7:
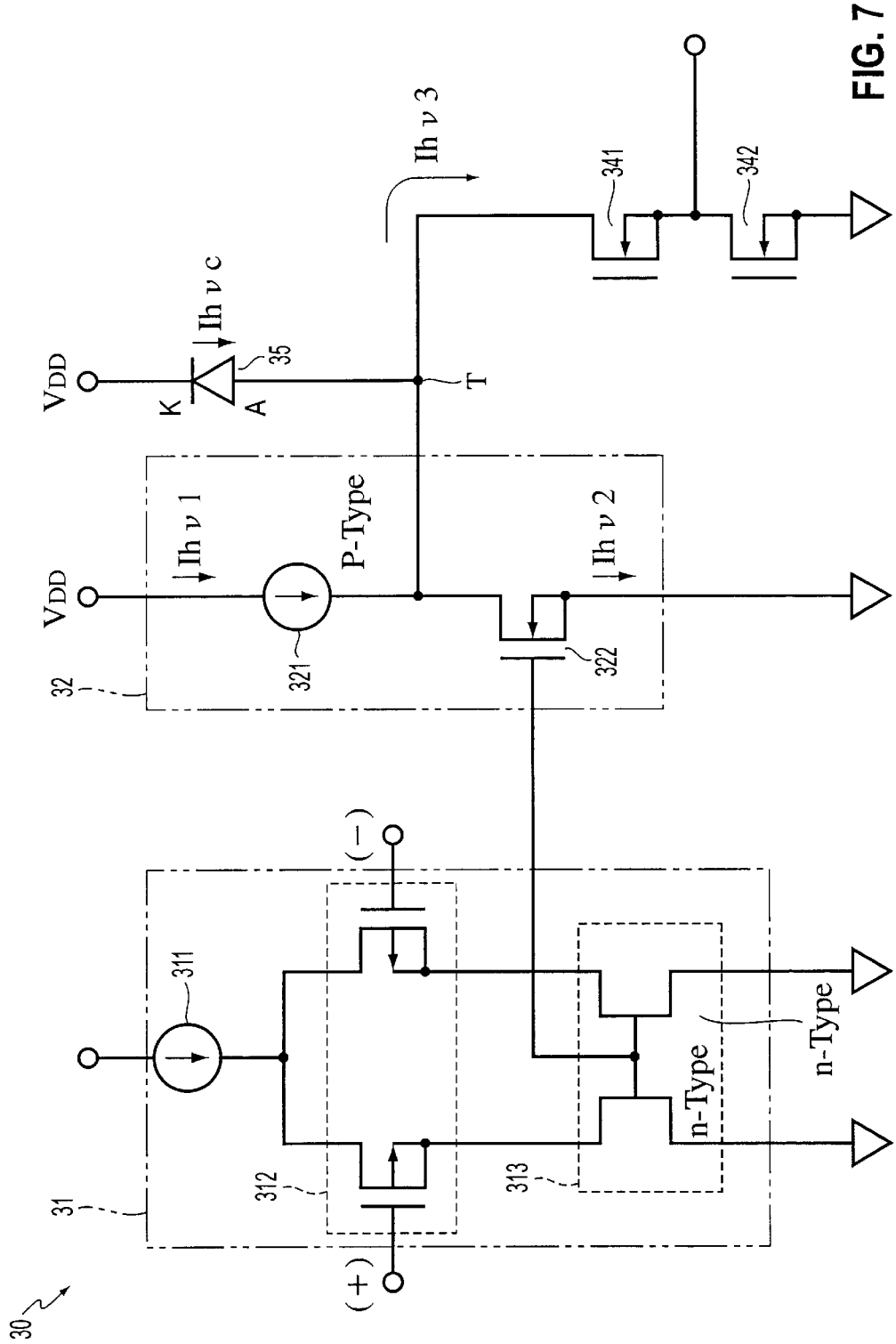
FIG. 7 is a circuit diagram showing another embodiment where the semiconductor device according to the present invention is applied to an operational amplifier in a drive circuit in a liquid crystal display.

FIG. 7 is a circuit diagram to show the embodiment 3 of this invention. In this example, two n-type MOSFETs 341 and 342 are connected in series to the operational amplifier 30 which is similar to FIG. 5. The load is the junction resistance of these MOSFETs 341 and 342. In other words, the first semiconductor circuit is formed by the operational amplifier 30 and a plural number of the voltage dividing resistances 341 and 342.

Moreover, in the circuit shown in FIG. 7, similar to FIG. 5, the diode 35 is formed at the output terminal T of the operational amplifier 30, with the anode A connected to the output terminal T, and with the cathode K to which voltage of the same potential as the bias voltage VDD of the current source 321 is applied.

When the circuit of the configuration described above is irradiated by the external light hv, it generates the light-excited current Ihv3 in the MOSFETs 341 and 342.

Accordingly, when the diode 35 is irradiated by the external light hv, it generates the light-excited current IhvC which is large enough to cancel the voltage fluctuation at the node T due to the light-excited current, Ihv2−Ihv1, and also the voltage fluctuation at the n-type MOSFETs 341 and 342 generated by the light-excited current Ihv3. In this case, it is preferable that the relation should satisfy the equation, IhvC=Ihv2−Ihv1+Ihv3. When the relation is Ihv1<Ihv2+Ihv3, then the diode 35 can be so designed as to satisfy the equation, IhvC=Ihv2+Ihv3.

Embodiment 4

Figure 8A:
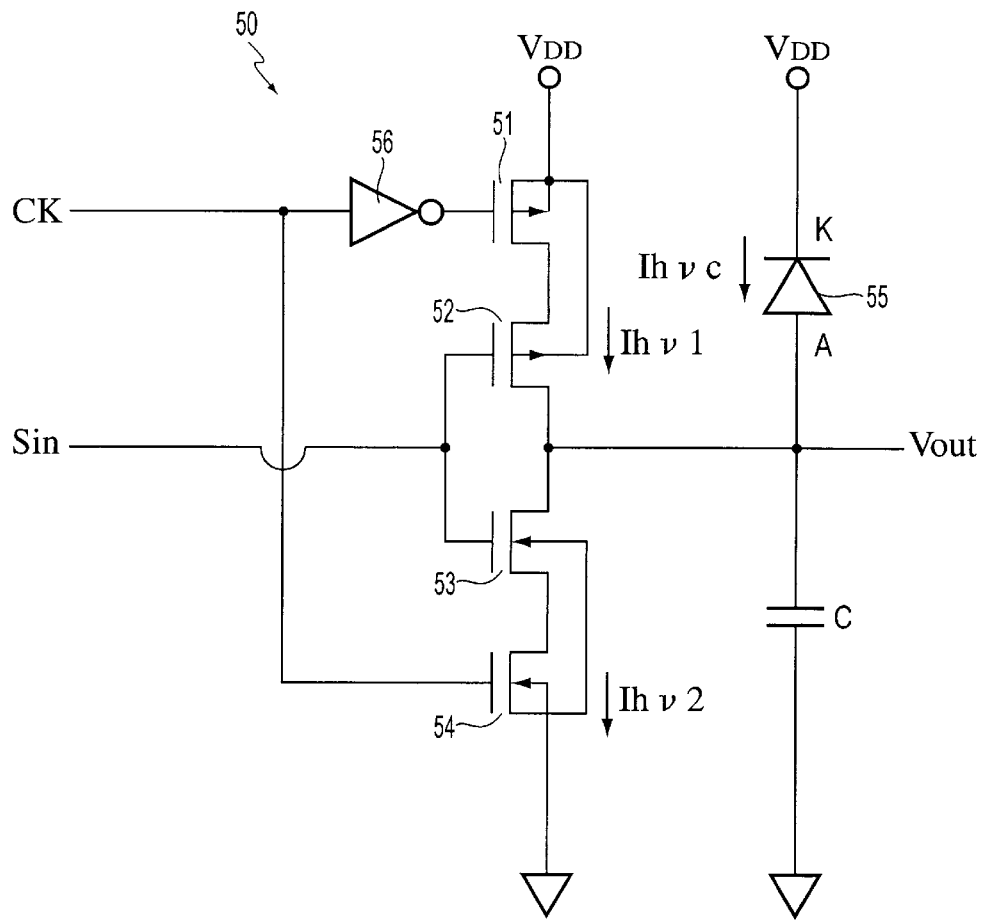
FIG. 8A is a circuit diagram showing an embodiment where the semiconductor device according to the present invention is applied to a dynamic hold circuit in a drive circuit in a liquid crystal display.
Figure 8B:
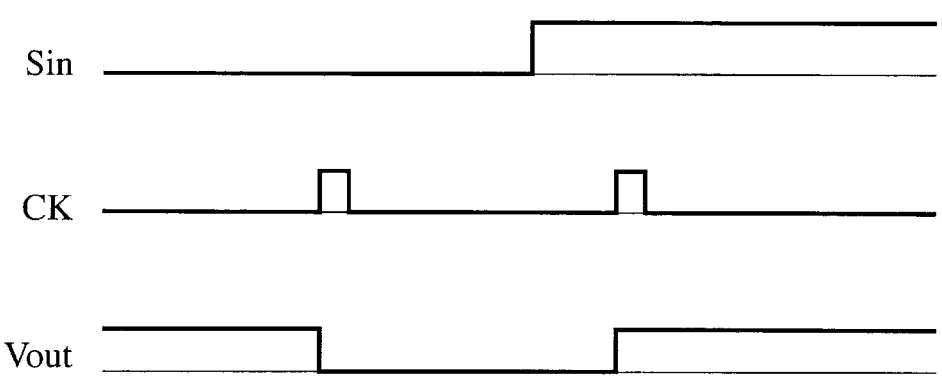
FIG. 8B is a timing chart showing the operation of FIG. 8A.

FIGS. 8A and 8B show the embodiment 4 in which the semiconductor device of this invention is applied to the dynamic operation circuit.

As shown in FIG. 8A, the dynamic operation circuit 50 comprises the following: two p-type MOSFETs 51 and 52 formed on the n-type substrate; a series connection circuit to two n-type MOSFETs 53 and 54; and the parasite capacitance c which is connected to the output terminal Vout and which serves as the charging and discharging means. One side of the series connection circuit is provided with a power supply voltage VDD and the other side thereof is ground potential.

Additionally, the clock CK is provided to the gate terminal of the p-type MOSFET 54 at the power supply voltage VDD side through the inverter 56 as the polarity reverse element. The input signal sin is provided to each gate terminal of the p-type MOSFET 52 and the p-type MOSFET 53.

In the dynamic operation circuit 50, as shown in FIG. 8B, the input signal sin is subjected to the dynamic hold by the parasite capacitance C under the timing of clock CK in order to output Vout. Here, if the external light hv is applied, the light-excited current Ihv1 is generated in the p-type MOSFETS 51 and 52, while the light excited current Ihv2 is generated in the p-type MOSFETs 53 and 54, resulting in a malfunction of the circuit.

For this reason, in the dynamic circuit 50 of this example, the anode A is connected to the output terminal vout, and the second semiconductor circuit which is the diode 55 as the carrier cancel element where the voltage VDD of the same potential as the power supply voltage VDD is applied, is formed at the cathode K.

By this configuration, the voltage fluctuation at the output terminal Vout is prevented because the diode 55 supplies the current IhvC to the parasite capacitance C to complement the insufficient charge (Ihv2−Ihv1) of the parasite capacitance C, when the dynamic operation circuit 50 is irradiated by the external light hv and the currents Ihv1 and Ihv2 are generated.

Embodiment 5

The guideline for designing the above-mentioned carrier cancel elements will be explained below. FIGS. 9A and 9B show the state that the external light hv irradiate the front and rear sides of a chip of layer structure, where the p-type well region 62 is formed in the n-type substrate 61, and the n-type (n+) region 63 is formed in this p-type well region 62. As shown in FIG. 9A, when the front side of the chip is irradiated by the light hv, the wavelength component of 400 to 800 nm is absorbed at the boundary between the n-type region 63 and the p-type well region 62, and the light-excited carriers (in this case, positive holes) are generated. The relationship between the wavelength component of the external light absorbed and the current Ihv generated at this time is shown in characteristics (a) in FIG. 10. The wavelength component of 400 to 1000 nm is absorbed at the boundary between the p-type well region 62 and the n-type substrate 61 (shown by the n-type substrate region 64) thereunder, and the light excited carriers (in this case, electrons) are generated. The relationship between the wavelength component of the external light absorbed and the current Ihv generated at this time is shown in Characteristics (b) in FIG. 10.

Moreover, as shown in FIG. 9B, when the rear side of the chip is irradiated by the light hv, the wavelength component of 700 to 1200 nm is absorbed at the boundary between the n-type substrate region 61 and the p-type well region 62, and the light-excited carriers (in this case, positive holes) are generated. The relationship between the wavelength component of the external light absorbed and the current Ihv generated at this time is shown in Characteristics (d) in FIG.10.

Incidentally, in FIGS. 9A and 9B, xn denotes the depth of the n-type region 63; Xp, the depth of the p-type well region 62; and Xs, the thickness of the n-type substrate 61. Here, it is preferable that Xp be 5 to 10 $\mu$m and that Xs be 500 to 600 $\mu$m.

Here, when the light is irradiated onto the chip front surface, the light current is expressed by the following equation, at the boundary between the n+ region and the p-type well region. In these equations, the light current density is denoted by jp; wavelength of light, $\lambda$; Planck's constant, h; absorption coefficient of silicon, a; incident light energy, PO; electric charge, q; velocity of light, c; diffusion length of positive hole, Lp; diffusion length of electron, Ln; and quantum efficiency, $\eta$.

$$jp=\{(\lambda \cdot q \cdot PO)/(hC)\}^*\exp\{-aXn\}^*[\exp(aLp)-\exp\{-a(Xp-Xn)/2\}] \quad \text{(Equation 1)}$$

However, it is preferable that the diffusion length of positive hole, Lp, be 0.3 to 0.5 $\mu$m; the diffusion length of electron, Ln, 30 to 40 $\mu$m; and the quantum efficiency, $\eta$, 1. Furthermore, at the boundary between the p-type well region and the n-type substrate region $$jp=\{(\lambda \cdot q \cdot PO)/(hC)\}^*\exp\{-aXn\}^*[\exp(aLp)-\exp\{-aLp\}] \quad \text{(Equation 2)}$$

when light is irradiated onto the chip rear surface, the light current at the boundary between the n+ region and the p-type well region is expressed by the following equation.

$$jp=\{(\lambda \cdot q \cdot PO)/(hC)\}^*\exp\{-a(Xs-Xn)\}^*[\exp(aLp)-\exp\{-a(Xp-Xn)/2\}] \quad \text{(Equation 3)}$$

Furthermore, at the boundary between the p-type well region and the n-type substrate region $$jp=\{(\lambda \cdot q \cdot PO)/(hC)\}^*\exp\{-a(Xs-Xp)\}^*[\exp(aLp)-\exp\{-aLn\}] \quad \text{(Equation 4)}$$

Accordingly, it is possible to approximately calculate the groove depth, the surface area, etc. of the well region of the MOSFET substrate, impurity region, impurity region of carrier cancel element, etc. by using the equations 1 to 4 and the spectral sensitivity characteristics of equations 1 to 4, depending whether a p-type substrate, n-type substrate, rear side irradiation, or front side irradiation is involved. The carrier cancel element can be easily designed with reference to these results of approximate calculations and the structure of the MOSFET for the principal circuit.

Embodiment 6

Figure 11:
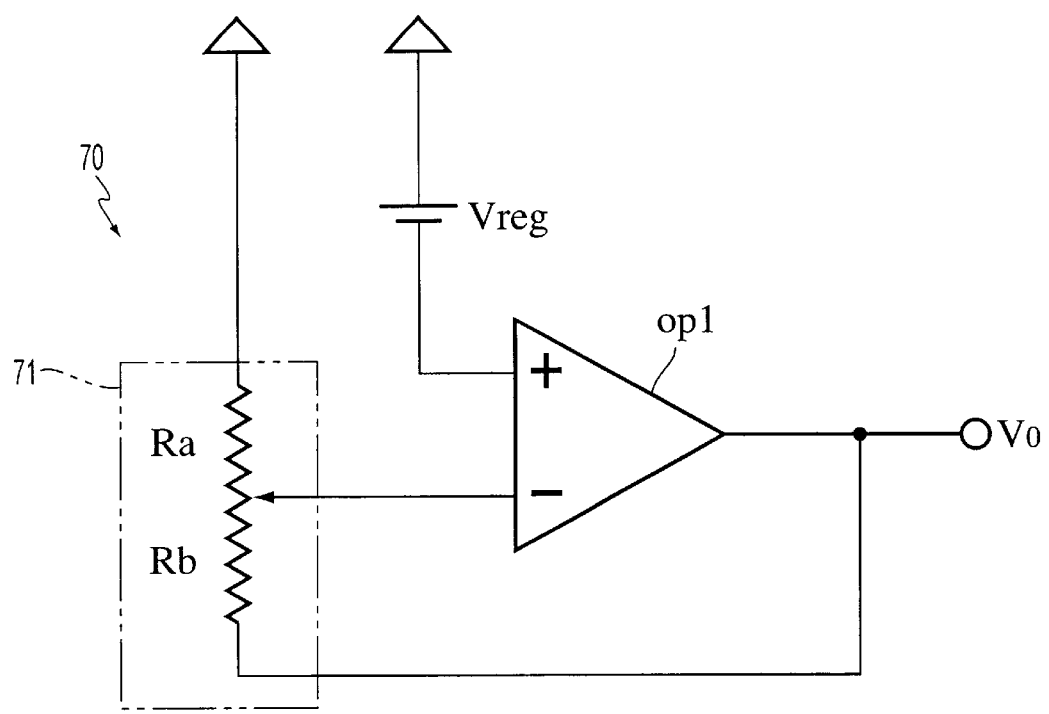
FIG. 11 is a circuit diagram showing an embodiment where the semiconductor device according to the present invention is applied to an operational amplifier with a high impedance resistance.

FIG. 11 shows an application of the carrier cancel element of this invention to the circuit to trim the input terminal voltage of an operational amplifier etc. particularly an operational amplifier which is used for an oscillation circuit regulator incorporated in a liquid crystal display device. In the operational amplifier OP1 as shown in FIG. 11, the output voltage Vo is expressed by:

$$Vo=(1+(Rb/Ra))*Vreg \qquad \text{(Equation 5)}$$

Here, a first semiconductor circuit 70 has an operational amplifier OP1 and a trimming circuit 71 which trims the input terminal (−) voltage of an operational amplifier OP1. The trimming circuit 71 adjusts the voltage which is input to one of the input terminals (−) of the operational amplifier OP1, by changing the resistance values, Ra and Rb.

Figure 12:
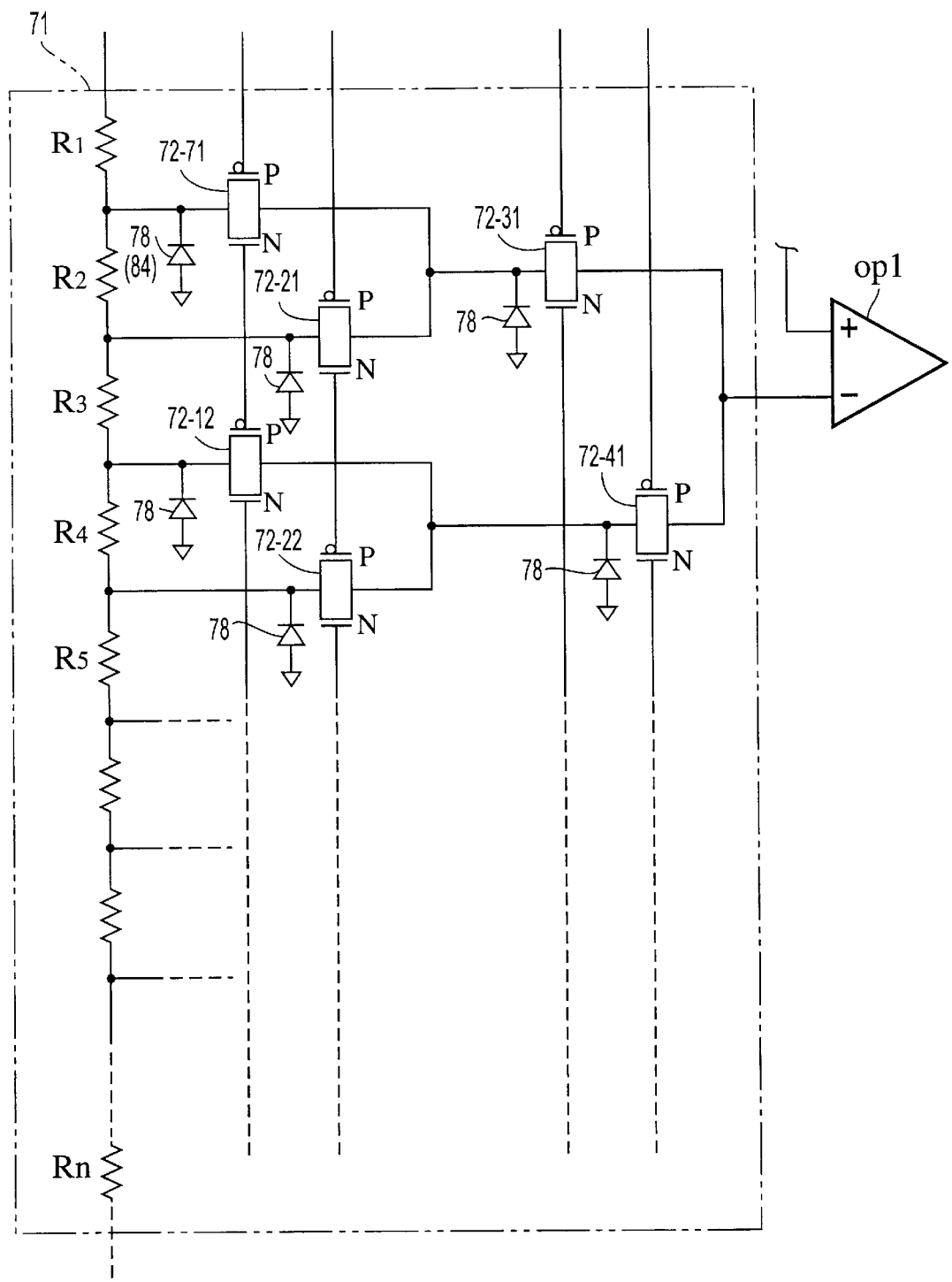
FIG. 12 is a circuit diagram showing details of the trimming circuit of FIG. 11.

This trimming circuit 71 has, as shown in FIG. 12, plural multi-stage series resistors R1 to Rn forming a high resistance circuit, and plural transmission gate 72 (72-11.72-21.72-31.72-41.72-12.72-22 . . . ) which serve as the switching means with a matrix array arrangement to trim the input voltage to the operational amplifier OP1 and which are connected between the input terminal (−) of the operational amplifier OP1 and the plural resistors.

Diodes 78 (84) as the second semiconductor circuit and carrier cancel element, are provided at each of the transmission gate 72 which serve as the plural switching means. As a result, when the first light excited current is generated at the transmission gate 72, the essential ON-OFF function does not work correctly; for example, despite the ON status of the transmission gate 72, the OFF function may be performed; or despite the OFF status, the ON function may be performed, resulting in various kinds of malfunction Therefore, in this invention, the diode 78 (84) is installed within the transmission gate 72. Therefore, the transmission gate 72 can perform the ON/OFF function correctly and it is possible to prevent such a malfunction wherein the ON function is mistaken for the OFF function, or the ON function is mistaken for the OFF function.

Figure 13:
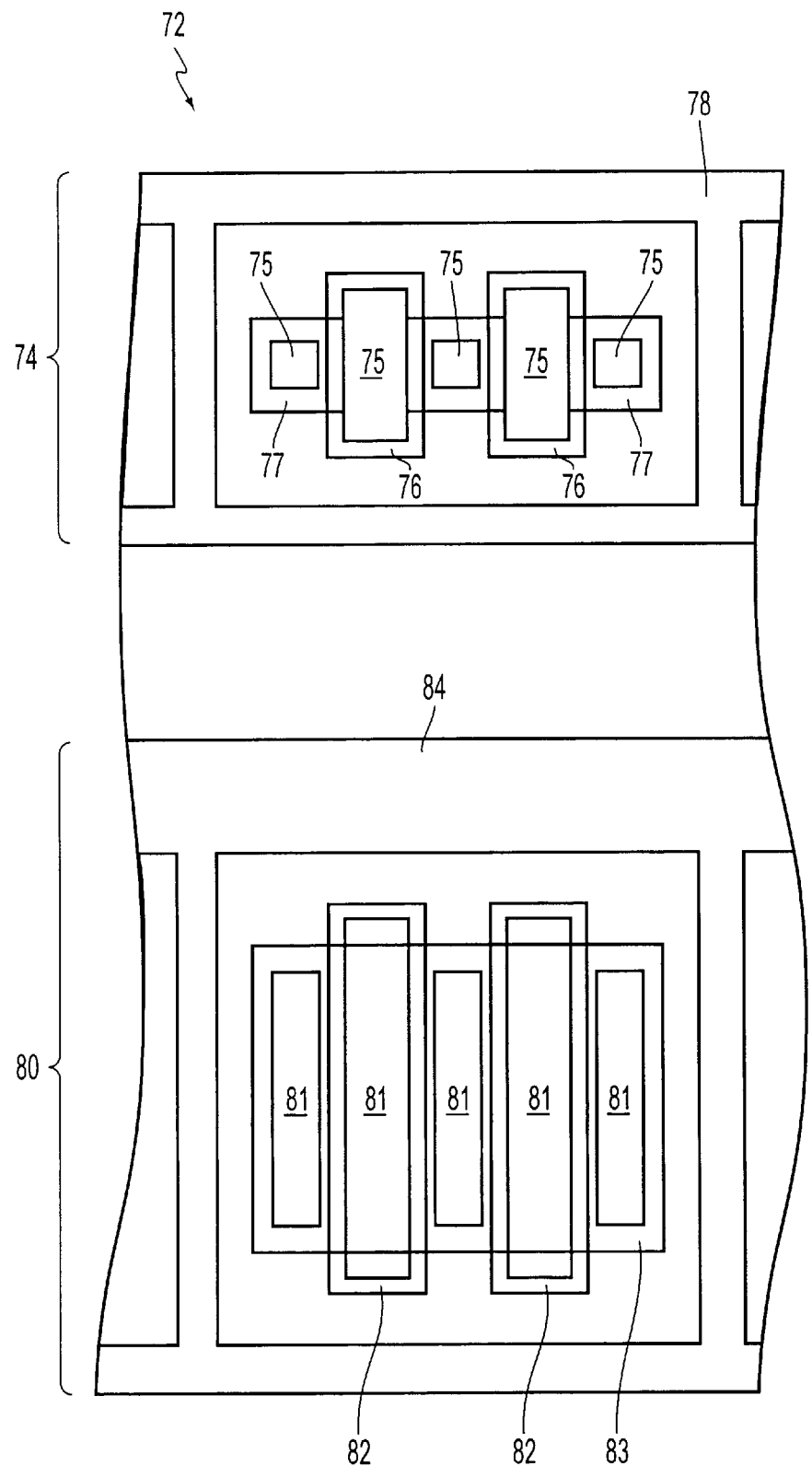
FIG. 13 is a plan view showing details of the structure of the transmission gate in FIG. 12.

The planar structure of the transmission gate 72 and the diode 78 (84) is shown in FIG. 13. The transmission gate 72 is formed, as shown in FIG. 13, by a Pch transistor part 74, and an Nch transistor part 80 which is provided symmetrically to the Pch transistor part 74. Further, the Nch transistor part 80 is slightly larger than the Pch transistor part 74. Additionally, an n+ region 78 which constitutes the diode is formed like a ring around the Pch transistor part 74. Furthermore, the p+ region 84 which constitutes the diode is formed like a ring around the Nch transistor part 80.

The Pch transistor part 74 has a plural, for example, two stage polysilicon layer 76 of planar square shape; a p+ region 75 which is formed in this polysilicon layer 76; plural, for example, three channel stop layer nst regions 77 which are formed between these polysilicon layers 76 ; and p+ regions 75 which are formed in these channel stop layer nst regions 77.

The Nch transistor part 80 has a plural, for example, two stage polysilicon layer 82 of planar square shape; an n+ region 81 which is formed in this polysilicon layer 82; plural, for example, three channel stop layer pst regions 83 which are formed between these polysilicon layers 82; and n+ regions 81 which are formed in these channel stop layer nst regions 83.

In this way, in the transmission gate 72, the configuration of the diode as the carrier cancel element is as follows. For the Nch transistor part 80, the p+ region 84 which constitutes the diode is formed like a ring around the Nch transistor part 80. For the Pch transistor part 74, the n+ region 78 which constitutes the diode is formed like a ring around the Pch transistor part 74. In this configuration, the carrier cancel element for the transmission gate can be formed with the minimum size based on the design rule, the layout area can be significantly small, and high integration and high density of chips are possible.

Incidentally, the transistors for the transmission gate in this example are different from the ordinary transistors shown in FIG. 3. In other words, the transistors shown in FIG. 13 are two pairs of transistors for high withstand voltage.

Embodiment 7

Figure 14A:
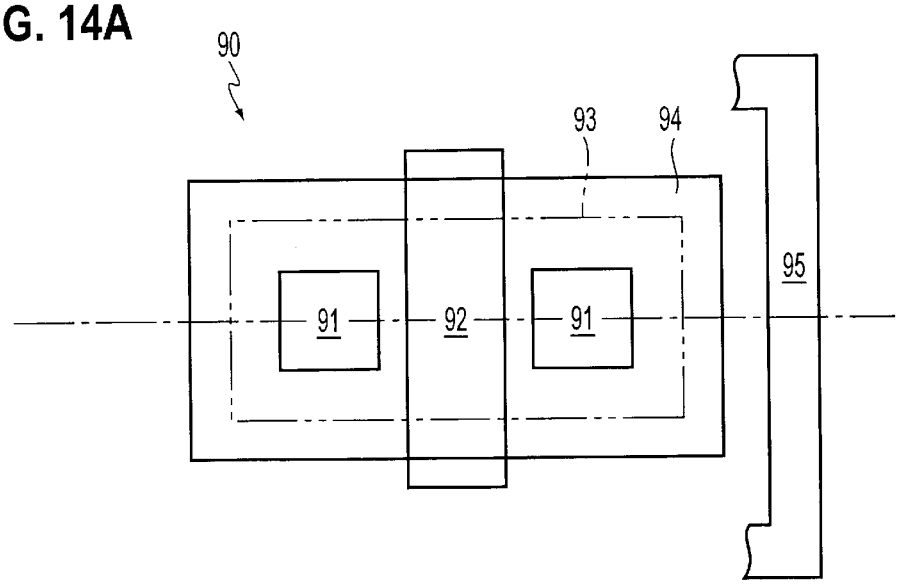
FIG. 14A is a plan view showing detail of a layout where the transmission gate in FIG. 12 is provided with an Nch high withstand voltage structure.
Figure 14B:
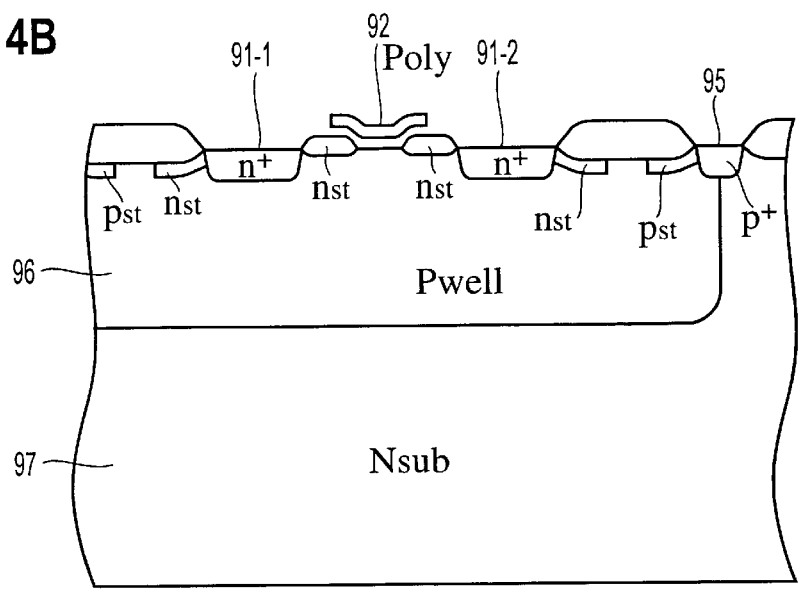
FIG. 14B is a cross-sectional view corresponding to FIG. 14A.

In FIG. 14, the structure of one pair of transistors for high withstand voltage is shown. As shown in FIG. 14B, an Nch part 90 of transistors for high withstand voltage has the following: an n-type semiconductor substrate 97; a p-type well 96 formed on the n-type semiconductor substrate 97; oxide film for separation of elements spaced and formed on this p-type well 96; n+ impurity layers 91-1 and 91-2 formed on the surface of an N-type semiconductor substrate 97 of a p-type well 96 between this oxide film; a p+ type impurity layer 95 which serves as carrier cancel element formed on the surface of the N-type semiconductor substrate 97, at the boundary between the p-type well 96 and the N-type semiconductor substrate 97; channel stop layers, nst and pst, which serve as reverse stop layers and which are formed on the rear face of the oxide film for separation of the elements; and a polysilicon gate electrode 92 which is formed between the central channel stop layers, nst and nst.

In FIG. 14A, the plan view of the Nch part 90 of the high withstand voltage transistor having the above-mentioned cross-sectional structure is shown. As shown in this figure, polysilicon gate electrode 92 is formed in the middle, and oxide film 92 is formed around the polysilicon gate electrode 91. Further, one pair of n+ type impurity layers 91-1 and 91-2 of planar square shape are formed symmetrically with respect to this metal-oxide 91 as the center. Additionally, the guard ring of the p+ type impurity layer 95 which constitutes the carrier cancel element is formed.

Figure 14C:
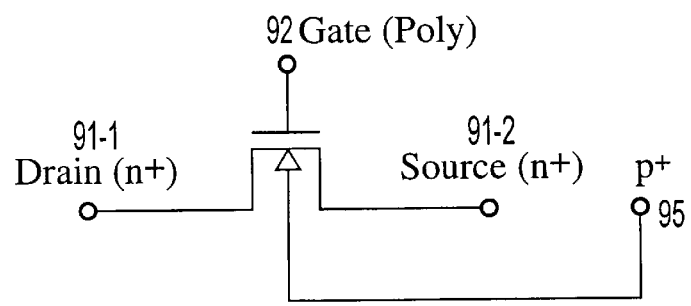
FIG. 14C is a circuit diagram when the structure in FIG. 14A is expressed with a functional circuit configuration.

FIGS. 14C shows the circuit diagram of the nch part high withstand voltage transistor and the p-type cancel element of the transmission gate having this type of cross-sectional and planar structures. As is clearly understood in comparison of FIG. 14C with FIG. 14B, the n+ type impurity layer 91-1 is the drain region and the n+ type impurity layer 91-2 is the source region.

In this way, when the diode as the carrier cancel element is formed on the high withstand voltage transistor, the p+ type impurity layer 95 which constitutes the diode is also formed like a ring around the transistor. In this configuration, the carrier cancel element can be formed with minimum size based on the design rules, the layout area can be significantly small, and high integration and high density of chips are possible.

Embodiment 8

Next, the embodiment of electronic equipment using the semiconductor device described above will be explained, using FIGS. 16 to 18.

The electronic equipment using the semiconductor circuit including the power supply circuit described above comprises he following, as shown in FIG. 16: a display information output source 1000; a display information processing circuit 1002; a display drive circuit 1004; a display panel such as a liquid crystal panel 1006; a clock generation circuit 1008; and an LCD power supply circuit 1010. The display information output source 1000 includes a memory such as a ROM and RAM, and the tuning circuit which tunes and outputs the TV signals etc., and it outputs a display information such as video signals based on a clock from a clock generation circuit 1008. The display information processing circuit 1002 processes and outputs the display information based on the clock from the clock generation circuit 1008. This display information processing circuit 1002 may include the following: for example, amplification and polarity reversal circuit; phase development circuit; rotation circuit; gamma correction circuit; or clamp circuit etc. The display drive circuit 1004 includes a scanning side drive circuit and a data side drive circuit, and displays and drives the liquid crystal panel 1006. Further, in FIG. 16, when a drive circuit for a COG (Chip On Glass) type of liquid crystal display is formed, the semiconductor circuit including the LCD power supply circuit 1010, the display drive circuit 1004, and the display panel 1006 are formed on the same substrate, in hardware configuration.

Here, when an LCD power supply circuit is formed by an IC chip etc., the LCD power supply circuit is mounted on a transparent substrate or a translucent substrate. When the transparent substrate is of suitable materials (for example, glass etc.) for formation of the semiconductor layer, the semiconductor circuit is formed directly on the substrate, and the LCD drive circuit is incorporated in the liquid crystal drive circuit which drives the pixel electrode arranged in a matrix of the liquid crystal display panel.

In this case, the LCD power source circuit 1010 includes an electronic volume circuit and a boosting circuit (not shown) in addition to the bias circuit and the voltage follower circuit mentioned in the embodiment 1 described above.

Further, in this example, the LCD power supply circuit 1010 is used concurrently as the main power supply circuit which supplies power to each circuit described above. However, the main power supply circuit which supplies power to each circuit described above may be installed separately from the LCD power supply circuit which is used exclusively for the display panel 1006. In this case, the bias circuit and the voltage follower circuit described above are used for the dedicated LCD power supply circuit, and particularly mounted as an IC in the display drive circuit 1004.

Furthermore, as electronic equipment of a configuration like this, the following can be listed: a multimedia compatible personal computer (PC) and engineering workstation (EWS), a cellular phone, PHS, word processor, TV, electronic notebook, electronic dictionary, electronic desk-top calculator, car navigation device, GPS, POS terminal, device provided with touch panel, etc. As an example, the pager 1100 shown in FIG. 17 has the following within the metal frame 1102: a crystal display substrate 1103; a light guide 1106 provided with a backlight 1106a; a circuit substrate 1108, as the COG module, on which is mounted one or plural IC chips 1109 having the semiconductor circuit including the LCD power supply circuit described above; first and second shield plates, 1110 and 1112; two elastic conductors, 1114 and 1116; and film carrier tape 1118. Two electric conductors 114 and 116 and the film carrier tape 1118 connect the liquid crystal display substrate 1103 and the circuit substrate 1108.

Figure 16:
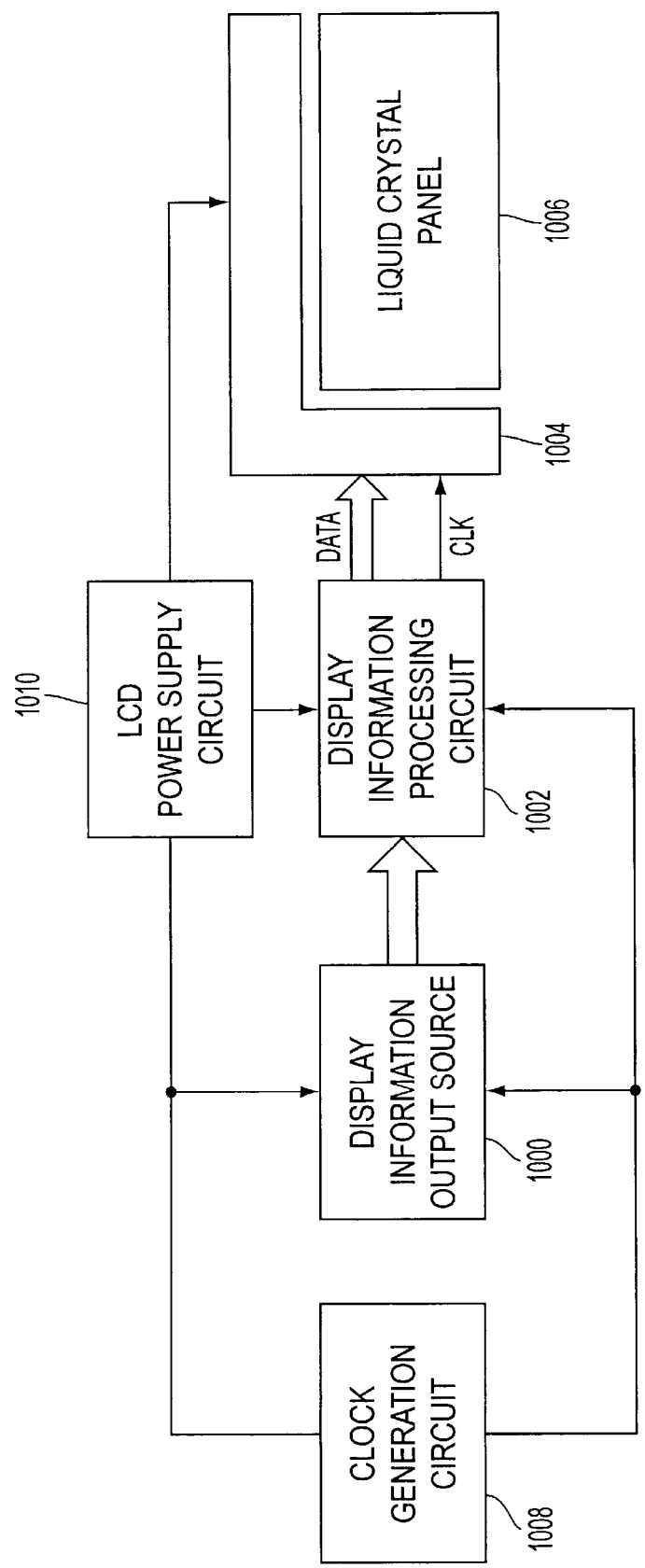
FIG. 16 is a block diagram of electronic equipment to which the present invention is applied.

Here, the liquid crystal display substrate 1103 is composed of liquid crystals sealed between two transparent substrates, 1104a and 1104b. In this way, the liquid crystal display panel of at least dot matrix type is composed. It is possible to form the drive circuit 1004, as shown in FIG. 16, or additionally the display information processing circuit 1002, on one of the transparent substrates. The circuit which is not mounted on the liquid crystal display substrate 1103 becomes the external circuit of the liquid crystal display substrate, and can be mounted on the circuit substrate 1108 in case of FIG. 17.

Figure 17:
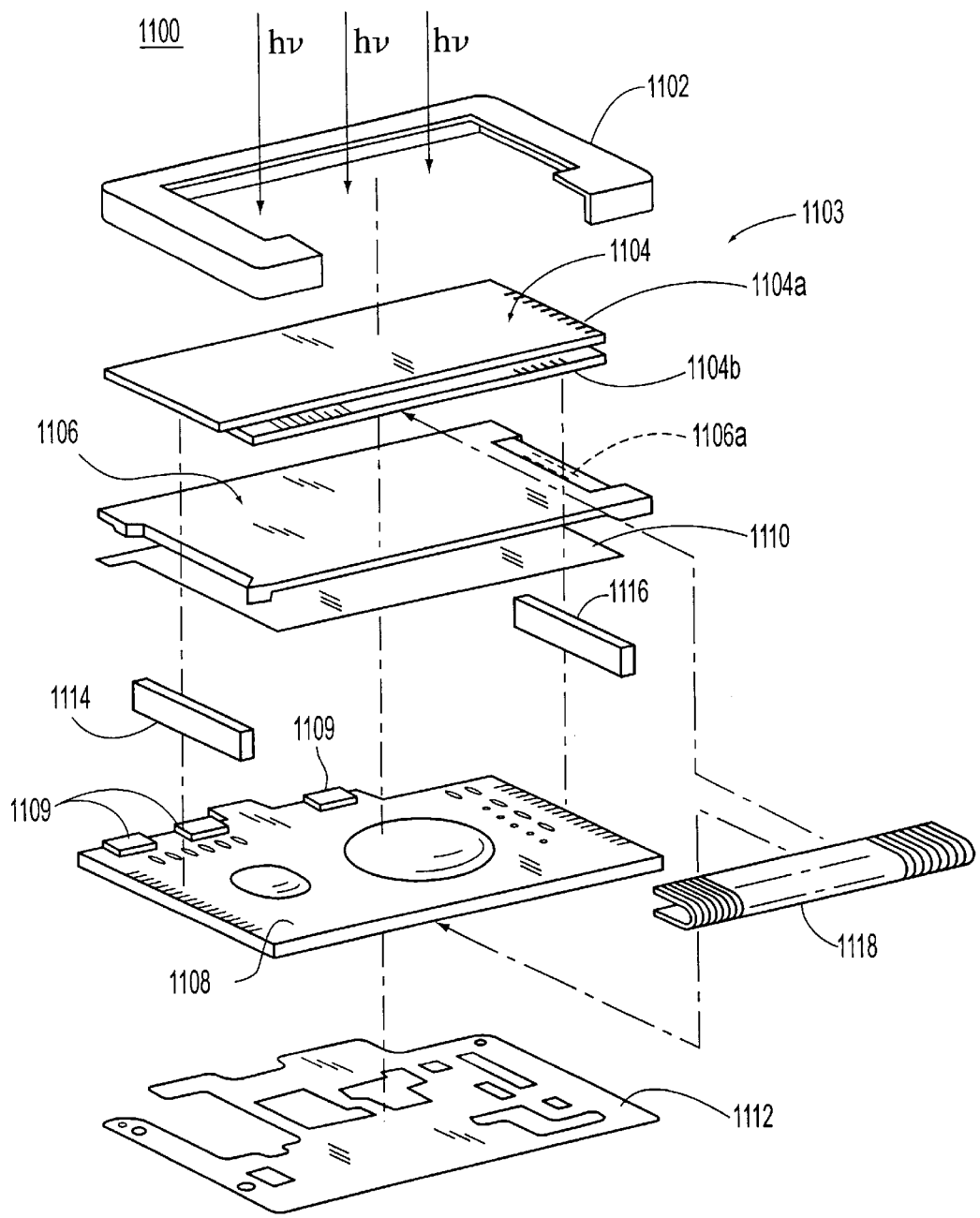
FIG. 17 is a perspective view of a pager to which the present invention is applied.

FIG. 17 shows the configuration of the pager, and therefore, a circuit substrate 1108 is necessary in addition to the liquid crystal display substrate 1103. However, when the liquid crystal display device is used as a component of electronic equipment and when the display drive circuit etc. is mounted on the transparent substrate, then the minimum unit of the liquid crystal display device is the liquid crystal display substrate 1103. Alternatively, the liquid crystal display substrate 1103 which is fixed to a metallic frame 1102 as a housing can be used as the liquid crystal display device as a component of electronic equipment. Further, in case of the backlight type, the liquid crystal display substrate 1103 and the light guide 1106 provided with the backlight 1106a can be incorporated in the metallic frame 1102 to compose the liquid crystal display device.

In particular, when the semiconductor device including the first and second semiconductor circuits described above is applied to the power supply circuit of the liquid crystal display panel COG-COF (Chip on Film) etc., it is possible to provide a liquid crystal display device which drives the liquid crystal display panel with stable voltage. In this way, it is possible to prevent such malfunction as mutilation of displayed character and shut down of an oscillation circuit which are caused by the voltage fluctuation due to the light. Thus, it is possible to use the device under bright summer sunshine and fluorescent lamps. Further, the glass substrate may be located on the front surface and the LCD panel substrate may be located on the rear surface, while the glass substrate may be located on the rear surface and the LCD panel substrate may be located on the front surface.

Figure 18:
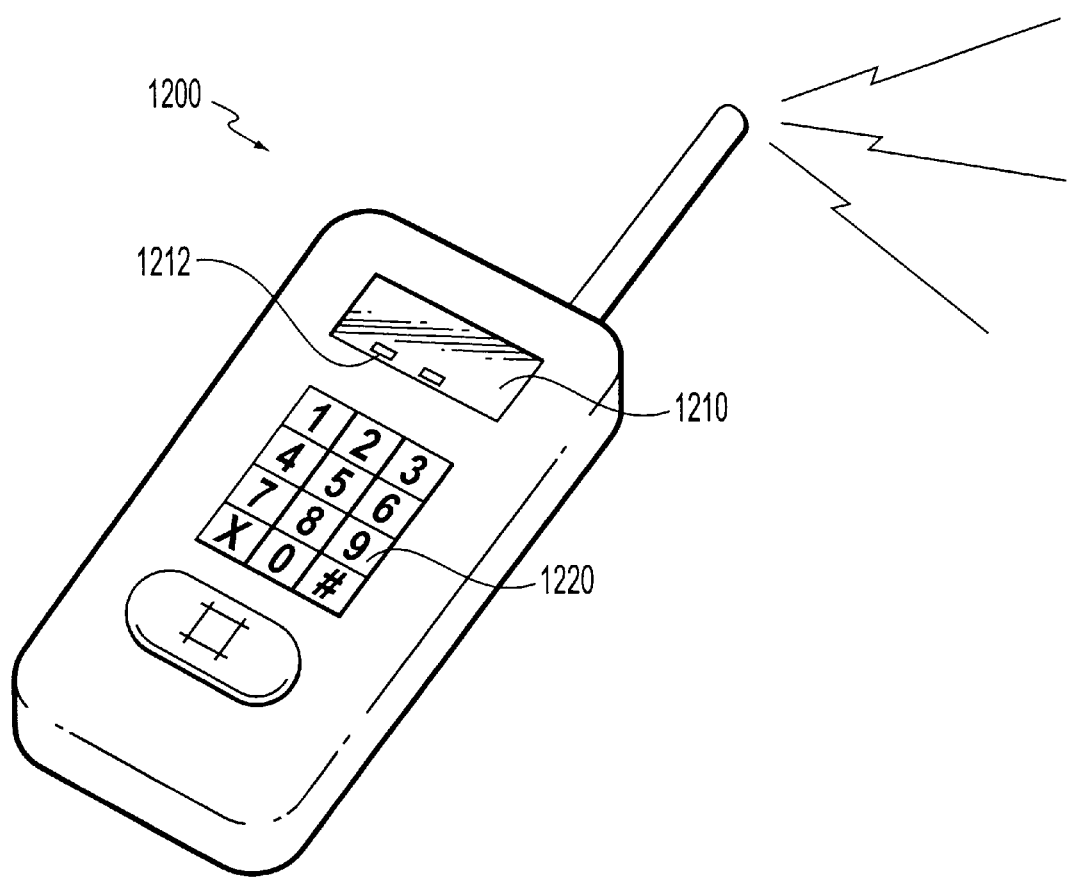
FIG. 18 is a perspective view of a cellular phone to which the present invention is applied.

Further, FIG. 18 shows a cellular phone 1200. This cellular phone 1200 has a liquid crystal display device 1210 which incorporates one or plural IC chips 1212 comprising a semiconductor circuit including the power supply circuit described above, and an input key 1200. The above-mentioned electronic equipment is, for example, portable electronic equipment using a battery (including a solar battery). It is preferred that the control means incorporated in such electronic equipment comprise the following: CPU, oscillation circuit, frequency dividing circuit, timer, main assembly power supply circuit for electronic equipment, ROM, RAM, control circuit, input circuit and output circuit as communication interface circuit etc. (not shown).

Further, the above-mentioned liquid crystal display device can be used for a personal portable information equipment (a personal digital assistance), one piece of electronic equipment, in addition to a cellular phone. In this case, the information equipment includes IC cards, a simultaneous interpretation system, hand writing screen, TV conference system, map information system, data producing system, etc. These image displays are performed by the liquid crystal display device of the present embodiment. Furthermore, it may form an input/output interface unit, including a speaker, microphone, input pen, earphone, etc.

Additionally, this invention is not limited to the above-mentioned embodiments, but can be modified within the scope of the summary of this invention. For example, it is not limited to an IC chip incorporating the carrier cancel element of this example which is mounted on the same substrate as the liquid display panel, and an IC for the power supply circuits as the semiconductor device. It may also be applied to various other kinds of IC chips, for example, a shift register circuit, drive circuit, A/D conversion circuit, regulator, operational amplifier, DRAM, SRAM, and other high-resistance circuits handling analog signals etc.

Furthermore, the circuit configuration to which the semiconductor device including the carrier cancel element of this example is applied may be essentially a circuit wherein the bias current is small and the resistance is high. Such a high resistance circuit may include a DRAM, $E^2ROM$, resistance dividing voltage generator, junction with driver attached to Pch, series ROM, COG with memory such as ROM etc. mounted, etc.

Additionally, when a plurality of first semiconductor circuits formed in the semiconductor device is not substantially affected in terms of circuit operation even if the carriers are generated by the irradiation of external light, then the first semiconductor circuit does not require an installation of the second semiconductor circuit. Further, when a plurality of first semiconductor circuits is formed in the semiconductor device, it is not always true that one first semiconductor circuit requires the installation of one second semiconductor circuit. For example, the current generated by a plurality of first semiconductor circuits when irradiated by external light may be canceled by the current generated by one second semiconductor circuit. Conversely, there may be a configuration where the current generated by one first semiconductor circuit is canceled by the current generated by a plurality of second semiconductor circuits.

The LCD panel substrate may be transparent or translucent. Further, the external light irradiated includes both natural light and artificial light irrespective of visible and invisible light.

Further, the first semiconductor circuit may include other circuits and elements such as a MOSFET and MOS diode. The second semiconductor circuit may include other circuits and elements such as a MOSFET, diode, p-type or n-type resistors.

Besides, this configuration is also applicable to other module forms, for example, a TCP (Tape Carrier Package) which cannot shield the light irradiating the rear, although the above description has addressed the configuration of the COG.

Additionally, the first semiconductor circuit and the second semiconductor circuit are formed on one IC, but, depending upon the circumstances, the first semiconductor circuit and the second semiconductor circuit may be formed separately.

Furthermore, the type of carrier generated as the second current in the second semiconductor circuit may be identical to or different from the type of carrier generated as the first current in the first semiconductor circuit. In other words, when the first semiconductor circuit generates electrons due to irradiation by external light, the second semiconductor circuit may generate either electrons or positive holes. Conversely, when the first semiconductor circuit generates positive holes due to irradiation by external light, the second semiconductor circuit may generate either positive holes or electrons.

For example, when the first semiconductor circuit is the n-type MOSPET, electrons are generated excessively from irradiation by external light. In this case, the second semiconductor circuit may be, for example, a n-type MOS element, a p-type MOS element, etc. The carriers which the element generates from irradiation by external light cancel the influence of the above-mentioned electrons generated by the n-type MOSFET (the influence on the circuit operation).

Additionally, the second semiconductor circuit may be connected to the first semiconductor circuit, irrespective of the method of connection, so that it may decrease or increase the voltage and cancel the voltage fluctuation partially or totally.

Further, if the external light does not uniformly irradiate the first semiconductor circuit, it is preferred that the first semiconductor circuit and the second semiconductor circuit be arranged as close as possible. If the external light is uniformly applied, it is not always necessary that the first semiconductor circuit be arranged close to the second semiconductor circuit which cancels the carriers generated by the light excitation in the first semiconductor circuit.

What is claimed is:

1. A semiconductor device comprising:
    at least one first semiconductor circuit in which a first current excited by external light is generated; and
    at least one second semiconductor circuit which is electrically connected to said first semiconductor circuit and is excited by said external light and in which a second current is generated to cancel a part or all of the voltage fluctuations produced by a current increment of said first current when said external light is shone.

2. The semiconductor device as defined in claim 1, wherein: said first semiconductor circuit increases voltage due to said first current; and
    said second semiconductor circuit decreases voltage due to said second current.

3. The semiconductor device as defined in claim 1, wherein: said first semiconductor circuit decreases voltage due to said first current; and
    said second semiconductor circuit increases voltage due to said second current.

4. The semiconductor device as defined in claim 1, wherein said second semiconductor circuit is disposed close to said first semiconductor circuit.

5. The semiconductor device as defined in claim 1, wherein said first semiconductor circuit includes a high resistance circuit.

6. The semiconductor device as defined in claim 5, wherein: said first semiconductor circuit includes an operational amplifier; and
    said second semiconductor circuit is connected to an output terminal of said operational amplifier.

7. The semiconductor device as defined in claim 6, wherein: said first semiconductor circuit further includes a voltage dividing resistance formed at the output terminal of said operational amplifier; and
    said second semiconductor circuit provides said second current with a magnitude to cancel the voltage fluctuations due to said first current and a current generated at said voltage dividing resistance.

8. The semiconductor device as defined in claim 5, wherein: said first semiconductor circuit includes a dynamic type operation circuit and charging and discharging means which are connected to an output terminal of said dynamic type operation circuit to charge and discharge a current; and
    said second semiconductor circuit is connected to said output terminal and is constituted so that said second current flows toward said charging and discharging means.

9. The semiconductor device as defined in claim 5, wherein: said first semiconductor circuit includes switching means; and
    said second semiconductor circuit is provided in said switching means.

10. The semiconductor device as defined in claim 9, wherein: said switching means is formed of a plurality of transmission gates; and said second semiconductor circuit is provided in each of said plural transmission gates.

11. The semiconductor device as defined in claim 10, wherein said second semiconductor circuit is formed of a junction diode.

12. The semiconductor device as defined in claim 5, wherein: said first semiconductor circuit includes at least one first conductive type transistor;

said second semiconductor circuit includes at least one second conductive type transistor with a conductivity opposite to that of said first conductive type transistor; and a complementary relationship is formed between said first and second conductive transistors.

13. A liquid crystal display device comprising:

a liquid crystal display panel includes a transparent or translucent substrate; and the semiconductor device as defined in claim 1 which is formed on the same substrate as said liquid crystal display panel.

14. A liquid crystal display device, wherein the semiconductor device as defined in claim 1 is incorporated in a liquid crystal drive circuit which drives pixel electrodes disposed in a matrix-like pattern of a liquid crystal display panel.

15. Electronic equipment, comprising the liquid crystal display device as defined in claim 13.

16. Electronic equipment, comprising the liquid crystal display device as defined in claim 14.

* * * * *